United States Patent
Yang et al.

(10) Patent No.: US 11,337,330 B2
(45) Date of Patent: May 17, 2022

(54) DETACHABLE PARTITION ASSEMBLY AND CHASSIS HAVING THE SAME

(71) Applicant: Wistron Corp., New Taipei (TW)

(72) Inventors: Qi-Hong Yang, New Taipei (TW); Chen Yang Wu, New Taipei (TW)

(73) Assignee: WISTRON CORP., New Taipei (TW)

( * ) Notice: Subject to any disclaimer, the term of this patent is extended or adjusted under 35 U.S.C. 154(b) by 155 days.

(21) Appl. No.: 15/930,551

(22) Filed: May 13, 2020

(65) Prior Publication Data

US 2021/0219451 A1 Jul. 15, 2021

(30) Foreign Application Priority Data

Jan. 15, 2020 (TW) .................................. 109101382

(51) Int. Cl.
*H05K 7/00* (2006.01)
*H05K 7/14* (2006.01)
*F16B 5/06* (2006.01)

(52) U.S. Cl.
CPC ......... *H05K 7/1488* (2013.01); *F16B 5/0614* (2013.01)

(58) Field of Classification Search
CPC .. H05K 7/1487; H05K 7/1421; H05K 7/1488; H05K 7/1489; H05K 7/183; H05K 7/14; H05K 7/0217; H05K 7/18; A47B 88/975; A47B 2088/976; F16B 5/0614; G06F 1/187; G06F 1/189; G11B 33/124; G11B 33/128
USPC ............ 312/265.6, 265.5, 223.1, 223.2, 351, 312/348.3, 184; 211/26, 184; 108/60, 108/61; 361/679.33, 679.02, 679.32, 361/679.34, 679.58, 724, 725, 727
See application file for complete search history.

(56) References Cited

U.S. PATENT DOCUMENTS

| | | | | |
|---|---|---|---|---|
| 4,676,384 A | * | 6/1987 | Schafer .................. | A47B 57/58 211/184 |
| 6,147,862 A | * | 11/2000 | Ho .......................... | G06F 1/181 312/223.2 |
| 7,128,379 B1 | * | 10/2006 | LaBonia, Jr. ...... | A47B 47/0075 312/351 |
| 9,974,202 B1 | * | 5/2018 | Good ................... | H05K 7/1421 |

(Continued)

FOREIGN PATENT DOCUMENTS

| CN | 104349634 | * | 2/2015 |
|---|---|---|---|
| CN | 206629365 U | | 11/2017 |

(Continued)

OTHER PUBLICATIONS

Taiwan Patent Office, "Office Action", dated Jul. 7, 2020.

*Primary Examiner* — Janet M Wilkens
(74) *Attorney, Agent, or Firm* — Locke Lord LLP; Tim Tingkang Xia, Esq.

(57) ABSTRACT

A detachable partition assembly includes a main plate body, a first engaging portion, a second engaging portion, and a first rail. The main plate body has a first edge and a second edge opposite to each other. The first engaging portion and the second engaging portion respectively protrude outwards from the first edge and the second edge. The first rail is located at a side of the main plate body and adjacent to the second engaging portion. The first rail is movably disposed on the main plate body to change a relative position between the first rail and the second edge.

13 Claims, 22 Drawing Sheets

(56) References Cited

U.S. PATENT DOCUMENTS

| | | | | |
|---|---|---|---|---|
| 2004/0221772 A1* | 11/2004 | Narkis | A47B 57/588 | 108/60 |
| 2006/0226104 A1* | 10/2006 | Schmidt | A47F 5/005 | 211/184 |
| 2008/0310123 A1* | 12/2008 | Sherrod | H05K 7/1488 | 361/725 |
| 2009/0194490 A1* | 8/2009 | Chen | G06F 1/187 | 211/41.12 |
| 2013/0009529 A1* | 1/2013 | Zhu | G06F 1/187 | 312/223.2 |
| 2015/0173235 A1* | 6/2015 | Ma | H05K 7/183 | 361/679.58 |
| 2017/0339799 A1* | 11/2017 | Su | H05K 7/1489 | |
| 2018/0116067 A1* | 4/2018 | Good | A47B 88/975 | |
| 2019/0059172 A1* | 2/2019 | Gupta | H05K 7/1492 | |
| 2020/0183466 A1* | 6/2020 | Chen | G06F 1/187 | |

FOREIGN PATENT DOCUMENTS

| | | | |
|---|---|---|---|
| EP | 0873705 | * | 10/1998 |
| GB | 826073 | * | 12/1959 |
| WO | 2013027285 | * | 2/2013 |

* cited by examiner

DETACHABLE PARTITION ASSEMBLY AND CHASSIS HAVING THE SAME

CROSS-REFERENCE TO RELATED APPLICATIONS

This non-provisional application claims priority under 35 U.S.C. § 119(a) on Patent Application No(s). 109101382 filed in Taiwan (ROC) on Jan. 15, 2020, the entire contents of which are hereby incorporated by reference.

TECHNICAL FIELD

The disclosure relates to a partition panel, more particularly to a detachable partition assembly and a chassis having the same.

BACKGROUND

As server technology progresses, the cloud services and IoT devices are growing prosperously these days, an information center can accommodate a great number of server hosts and store them in chassis for convenient management.

Considering the flexibility of arrangement and convenience of operation, the server hosts are often having a withdrawable design, and some of the storage spaces in the chassis are provided with a partition panel for dividing the storage spaces into smaller areas for different server hosts. However, the conventional partition panels for server chassis are non-removable or fixed via screws resulting in a troublesome removal, which makes the space utilization of the chassis inflexible for some applications. In addition, the server hosts are heavy in weight due to their compact interior arrangement, so that it would be inconvenience to move them on the chassis.

Therefore, it is desired to have a partition means that can optimize space utilization and can be installed and removed in a flexible and convenient manner.

SUMMARY

One embodiment of the disclosure provides a detachable partition assembly including a main plate body, a first engaging portion, a second engaging portion, and a first rail. The main plate body has a first edge and a second edge opposite to each other. The first engaging portion and the second engaging portion respectively protrude outwards from the first edge and the second edge. The first rail is located at a side of the main plate body and adjacent to the second engaging portion. The first rail is movably disposed on the main plate body to change a relative position between the first rail and the second edge.

Another embodiment of the disclosure provides a chassis including a chassis body and the detachable partition assembly. The chassis body includes at least one first layer board and at least one second layer board. The detachable partition assembly is located between the at least one first layer board and the at least one second layer board. The first engaging portion and the second engaging portion are respectively detachably engaged with the at least one first layer board and the at least one second layer board. The first rail is stacked on the at least one second layer board.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
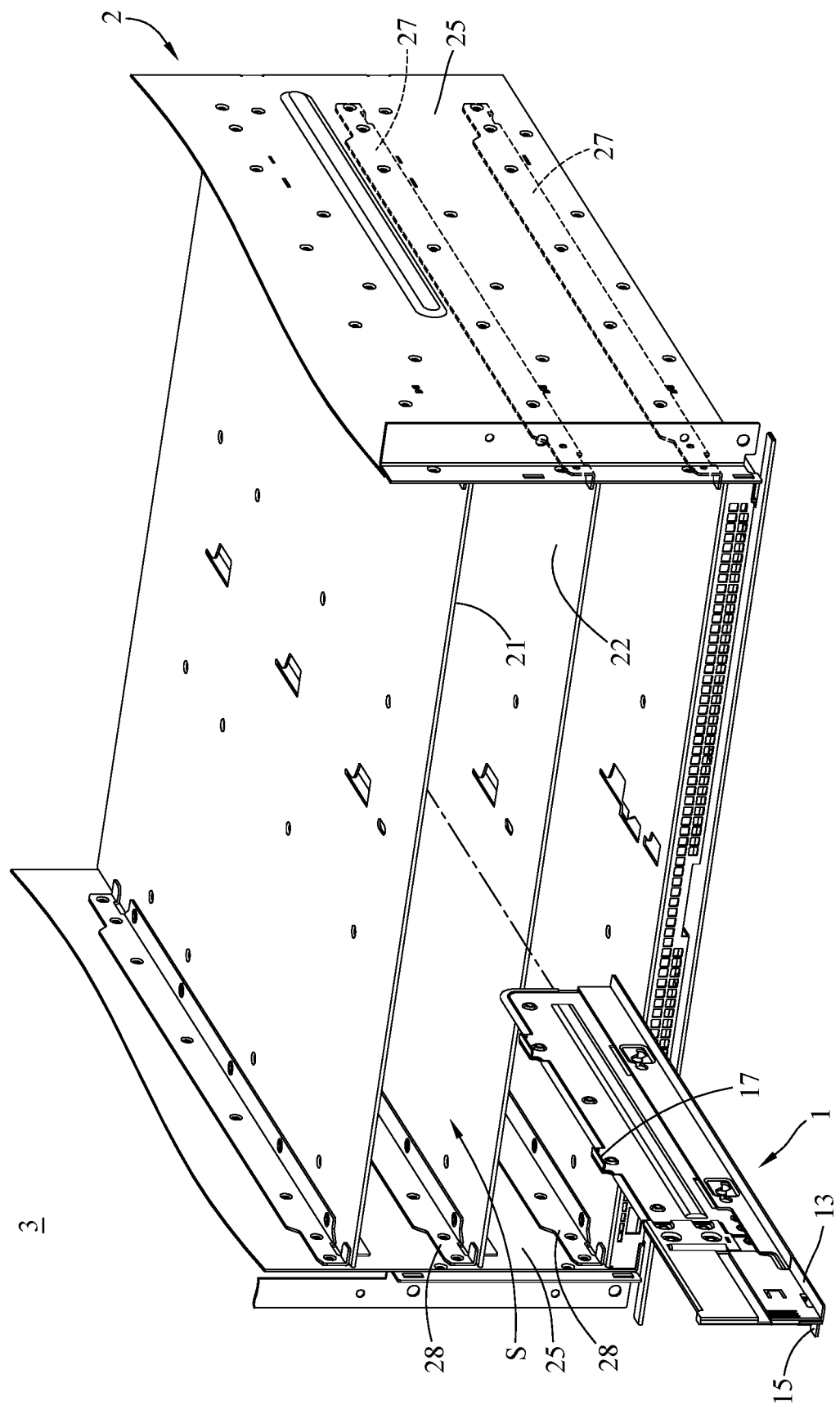
FIG. 1 is a perspective exploded view of a chassis according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Note that the actual size and designs of the product manufactured based on the teaching of the present disclosure may also be properly modified according to any actual requirement.

Further, as used herein, the terms "end", "part", "portion" or "area" may be used to describe a technical feature on or between component(s), but the technical feature is not limited by these terms. In addition, unless otherwise specified, the term "substantially", "approximately" or "about" may be used herein to provide an industry-accepted tolerance to its corresponding term without resulting in a change in the basic function of the subject matter at issue.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Firstly, referring to FIG. 1, one embodiment of the disclosure provides a chassis 3. The chassis 3 may include at least one detachable partition assembly 1 and a chassis body 2. The chassis 3 is, but not limited to, a server chassis, and is suitable for accommodating several sever hosts (not shown) of the same or different sizes into the chassis body 2. The chassis body 2, illustrated in drawings, is exemplary for the comprehension of the disclosure, and the disclosure is not limited by its configuration. In addition, for the purpose of simple illustration, the detachable partition assembly 1 and/or the chassis body 2 may be partially shown in the drawings, and some unnecessary details, such as cables, screws, other casings, and electrical components may be simplified or omitted from the drawings.

In this embodiment, the chassis body 2 may include at least one first layer board 21, at least one second layer board 22, and a plurality of side plates 25. The first layer board 21 and the second layer board 22 are located between and connected to the side plates 25 and are spaced apart from each other by a specific distance, such that the first layer board 21, the second layer board 22, and the side plates 25 together form at least one interlayer space S therebetween. The interlayer space S is suitable for accommodating one larger sized server host (not shown). Note that the first layer board 21 and the second layer board 22 may have the same or similar configuration, but the disclosure is not limited thereto.

In addition, the chassis body 2 may further include at least one rail 27 and at least one rail 28. The rail 27 and the rail 28 may be disposed on a surface of the second layer board 22 facing the first layer board 21 and respectively located at two opposite sides of the second layer board 22 connected to the side plates 25. The rail 27 and the rail 28 protrude from the surface of the second layer board 22 and are configured to support and guide the server host being accommodated in the interlayer space S, such that the server host can be spaced apart from the surface of the second layer board 22 by a proper distance. This prevents a large area of the server host from contacting the surface of the second layer board 22 and thereby greatly reducing the friction during the sliding of the server host. Note that the rails 27 and 28 are not restricted to be bent plates as illustrated in the drawings; in some embodiments, the aforementioned rails 27 and 28 may be protrusions of other suitable shapes integrally formed on the second layer board.

In this and some other embodiments, the detachable partition assembly 1 is detachably disposed in the interlayer space S of the chassis body 2. The detachable partition assembly 1 is configured to divide the interlayer space S into at least two smaller sized interlayer spaces (as the sub-interlayer spaces S' shown in FIGS. 7 and 8) for accommodating at least two smaller sized server hosts (not shown). Herein, as shown, the detachable partition assembly 1 has a first rail 13 and a second rail 15 which respectively extend in opposite lateral directions and respectively correspond to the rails 27 and 28 of the second layer board 22. Similarly, the first rail 13 and the rail 27 and the second rail 15 and the rail 28 are configured to support and guide the server host being accommodated in the interlayer spaces so as to reduce the friction during the sliding of these server hosts. The said "lateral direction" is denoted as a direction pointing towards the side plate 25 of the chassis body 2 from the detachable partition assembly 1; specifically, the lateral direction is denoted as a direction substantially parallel to the normal line of the side plate 25, however, the term "lateral direction" is merely for the purpose of easy explanation and not intended to limit the disclosure.

Figure 2A:
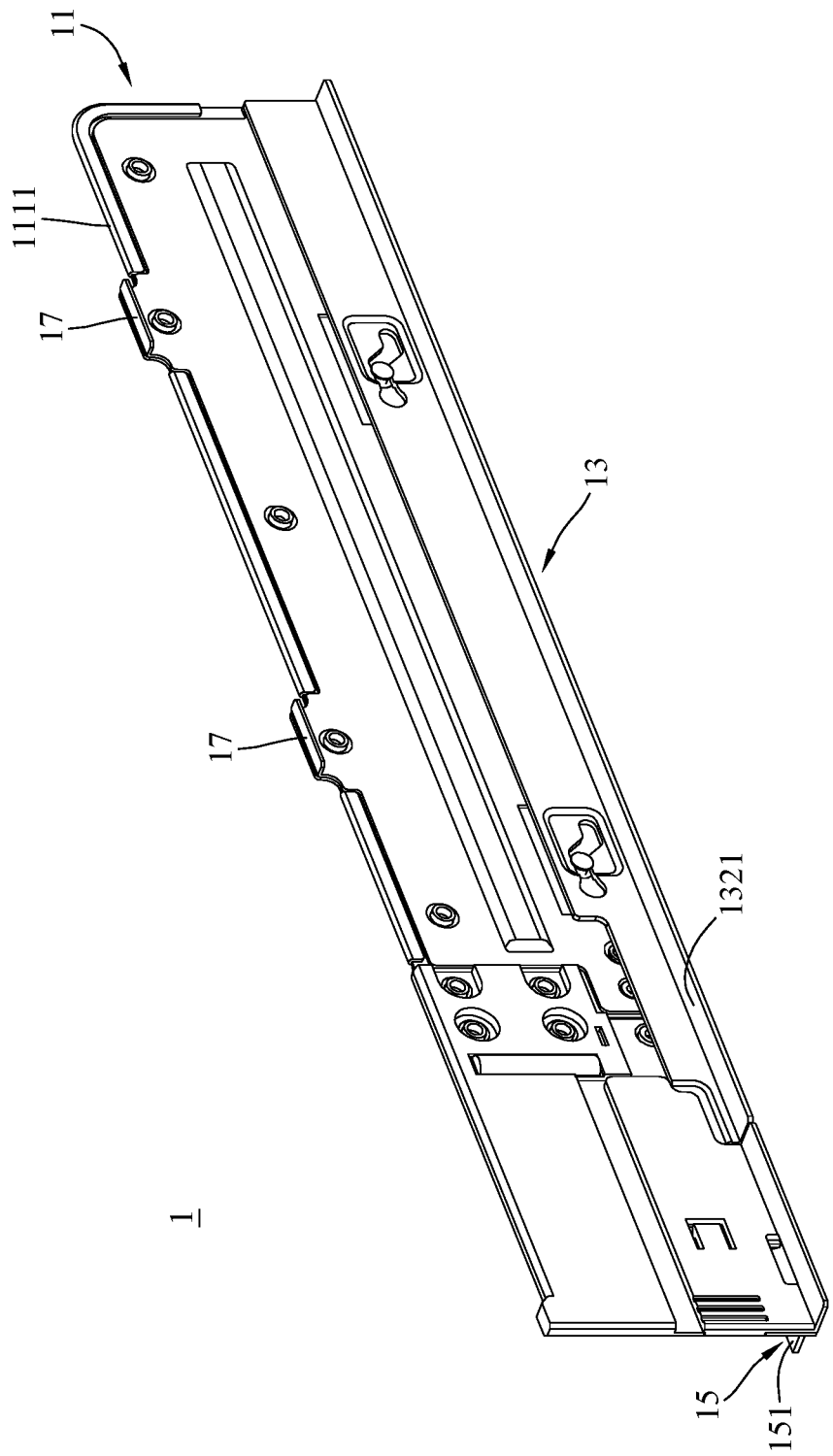
FIGS. 2A-2B are perspective views of a detachable partition assembly in FIG. 1, taken from different viewpoints.
Figure 2B:
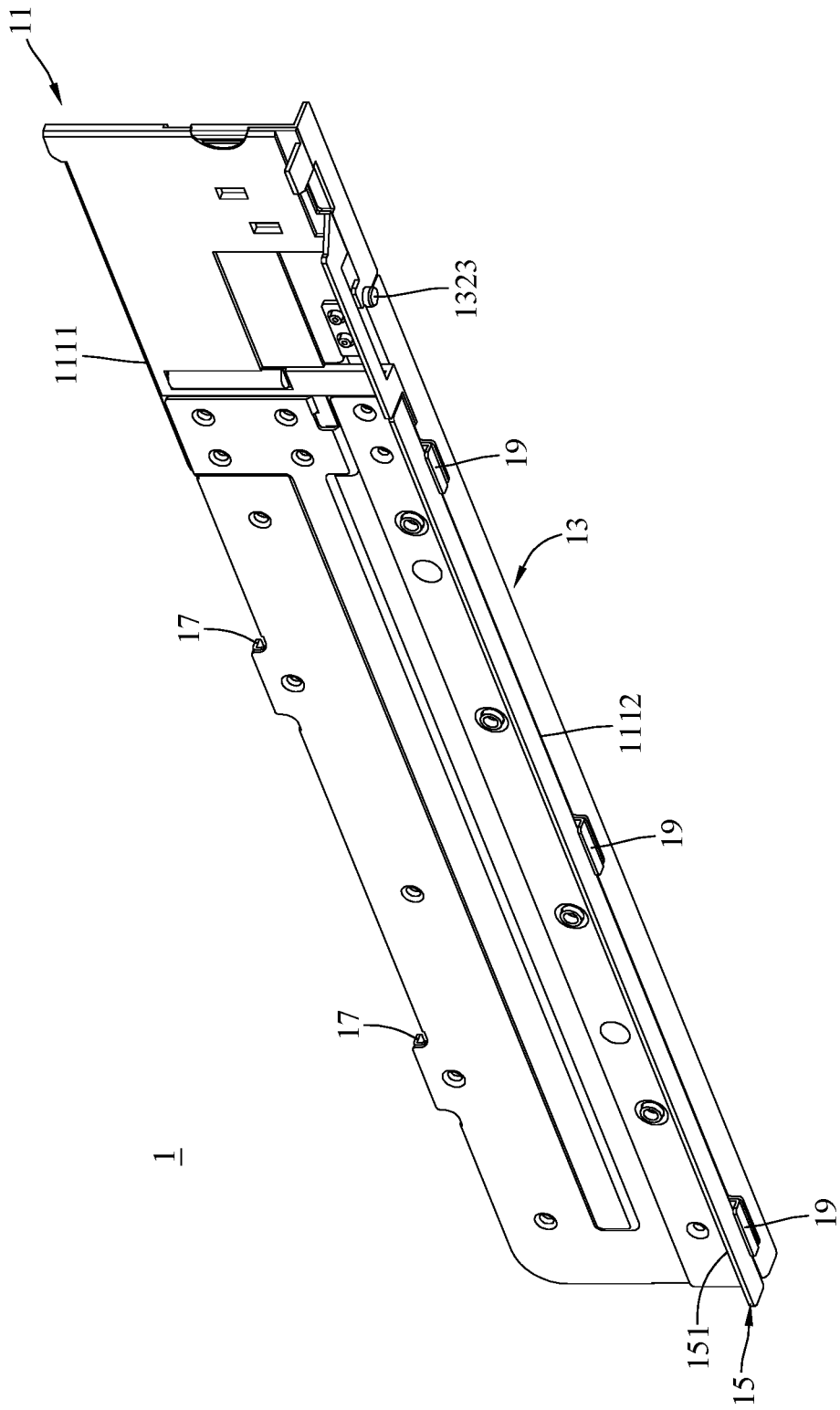
Figure 3A:
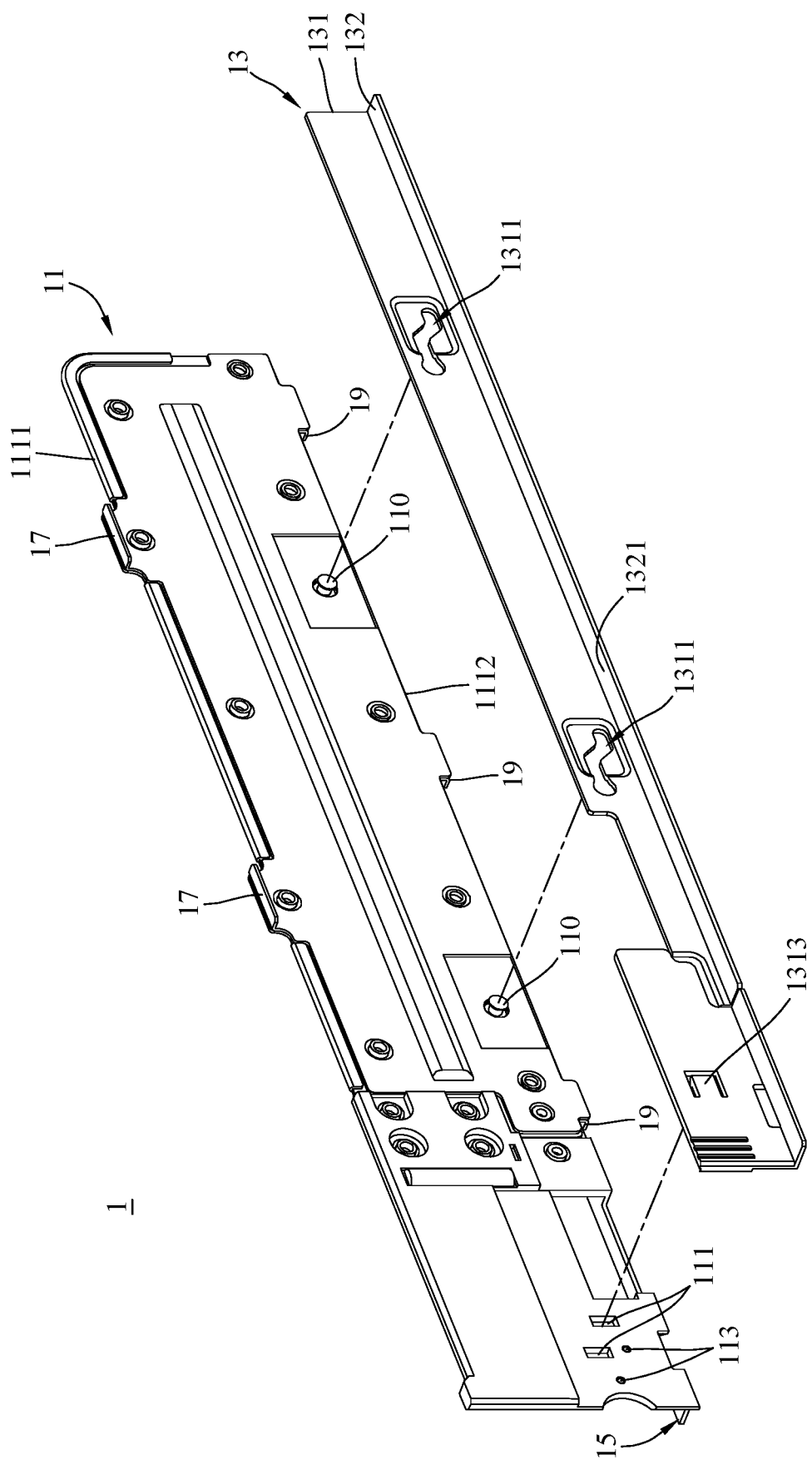
FIGS. 3A-3B are perspective exploded views of the detachable partition assembly in FIG. 1, taken from different viewpoints.
Figure 3B:
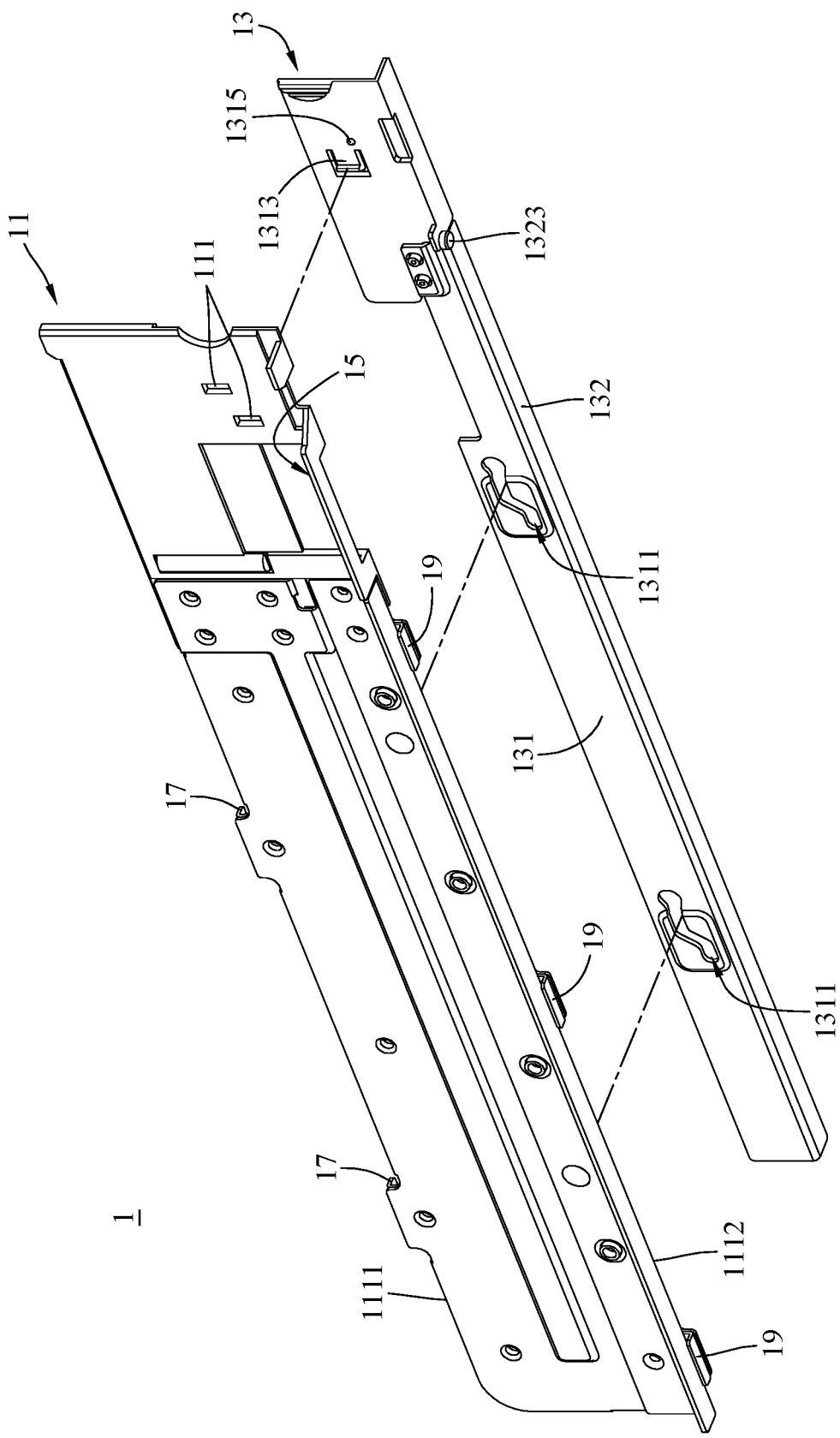

Then, referring to FIGS. 2A-3B, the detail of the detachable partition assembly 1 for quick installation/detachment and being used as rail will be described hereinafter, where FIGS. 2A-2B are perspective views of the detachable partition assembly 1 in FIG. 1 taken from different viewpoints, and FIGS. 3A-3B are perspective exploded views of the detachable partition assembly 1 in FIG. 1 taken from different viewpoints.

In this embodiment, the detachable partition assembly 1 may at least include a main plate body 11, at least one first engaging portion 17, at least one second engaging portion 19, and the aforementioned first rail 13 and second rail 15. The main plate body 11 is served as the main portion of the detachable partition assembly 1 for dividing the interlayer space S. The main plate body 11 has a height approximately the same as that of the interlayer space S, where the height of the interlayer space S is defined by the vertical distance between the first layer board 21 and the second layer board 22. The main plate body 11 is, but not limited to, consisted of plural plate pieces, but the disclosure is not limited thereto; in some other embodiments, the main plate body may be a single plate.

The first engaging portion 17 and the second engaging portion 19 respectively extend from two opposite ends of the main plate body 11. Specifically, as shown, the first engaging portion 17 and the second engaging portion 19 respectively extend in lateral directions from the opposite edges (e.g., a first edge 1111 and a second edge 1112) of the main plate body 11 that are used to contact the first layer board 21 and the second layer board 22. The first engaging portion 17 and the second engaging portion 19 are respectively configured to be detachably engaged with mounting holes of the first layer board 21 and the second layer board 22 (e.g., first mounting holes 211 and second mounting holes 221 shown in FIGS. 5A and 5B). In this embodiment, each of the first engaging portion 17 and the second engaging portion 19 can be a protrusion in a hook shape or another suitable shape configured to be engaged with mounting holes or suitable recesses of the first layer board 21 and the second layer board 22, but the disclosure is not limited thereto; in other embodiments, each of the first engaging portion 17 and the second engaging portion 19 and the respective mounting holes or recesses of the first layer board 21 and the second layer board 22 can be switched places. In this embodiment, the first engaging portion 17 and the second engaging portion 19 extend in opposite directions from the main plate body 11, but the disclosure is not limited thereto; in some other embodiments, the first engaging portion 17 and the second engaging portion 19 may extend in the same direction from the main plate body 11. In addition, in this embodiment, the first engaging portion 17 and the second engaging portion 19 are, but not limited to, integrally formed with the main plate body 11, but the disclosure is not limited thereto; in some other embodiments, the first engaging portion 17 and the second engaging portion 19 may be two independent pieces being mounted on the main plate body 11.

The first rail 13 and the second rail 15 are respectively disposed on two opposite surfaces of the main plate body 11, in other words, the main plate body 11 is located between the first rail 13 and the second rail 15. In this embodiment, the first rail 13 is movably disposed on the main plate body 11; specifically, the first rail 13 may at least include a mounting portion 131 and a rail portion 132. The mounting portion 131 is movably disposed on the main plate body 11 and is particularly for the installation of the first rail 13 onto the main plate body 11. The rail portion 132 is connected to a side of the mounting portion 131 so that the rail portion 132 and the mounting portion 131 can be moved along with each other. And the rail portion 132 extends in the lateral direction away from the mounting portion 131 and can be served to support and guide the server host. In detail, the rail portion 132 has a first bearing surface 1321, the first bearing surface 1321 and the aforementioned rail 27 can together support and guide a server host. On the other hand, the second rail 15 is immovably disposed on the main plate body 11. The second rail 15 extends in the lateral direction away from the main plate body 11 and has a second bearing surface 151, and the second bearing surface 151 and the aforementioned rail 28 can together support and guide another server host.

In more detail, in this embodiment, the main plate body 11 may have at least one guiding post 110, at least one positioning slot 111, and at least one first auxiliary positioning part 113, and the mounting portion 131 of the first rail 13 may have at least one guide hole 1311, an elastic positioning plate 1313, and a second auxiliary positioning part 1315. The guiding post 110 of the main plate body 11 is slidably located at the guide hole 1311 of the mounting portion 131. The positioning slots 111 and the first auxiliary positioning parts 113 of the main plate body 11 may be divided into two groups; the elastic positioning plate 1313 of the mounting portion 131 can be detachably engaged with one of the positioning slots 111, and the second auxiliary positioning part 1315 can be detachably engaged with one of the first auxiliary positioning parts 113 which is located next to the positioning slot 111 being engaged with the elastic positioning plate 1313. One of the first auxiliary positioning part 113 and the second auxiliary positioning part 1315 may be a protruding dot or bump, and the other may be a hole or recess fitting the bump. Note that the positioning slot 111 of the main plate body 11 and the elastic positioning plate 1313 of the first rail 13 may be switched places, and the disclosure is not limited thereto.

In such an arrangement, the first rail 13 can be fixed in specific positions on the main plate body 11. Please also further refer to FIG. 4A, the elastic positioning plate 1313 and the second auxiliary positioning part 1315 of the first rail 13 are respectively engaged with the positioning slot 111 and the first auxiliary positioning part 113 of the main plate body 11 which are relatively close to the guiding post 110, at this moment, the first rail 13 is in an initial position. Then, please further refer to FIG. 4B, with the help of the cooperation of the guiding post 110 and the guide hole 1311, the first rail 13 can be moved along a predetermined path with respect to the main plate body 11, and the elastic positioning plate 1313 and the second auxiliary positioning part 1315 of the first rail 13 can be moved to respectively engage with the positioning slot 111 and the first auxiliary positioning part 113 of the main plate body 11 which are relatively away from the guiding post 110; at this moment, the first rail 13 is in an uplift position.

Note that the first rail 13 including portions such as the elastic positioning plate 1313 are elastic in material, thus a proper force can force the elastic positioning plate 1313 to deform and disengage from the positioning slot 111 of the main plate body 11 and force the second auxiliary positioning part 1315 to disengage from the first auxiliary positioning part 113 of the main plate body 11. However, the first auxiliary positioning part 113 and the second auxiliary positioning part 1315 may be optional; in some other embodiments, the detachable partition assembly may not have the aforementioned first auxiliary positioning part 113 and second auxiliary positioning part 1315.

As shown, when the first rail 13 is switched to the uplift position from the initial position, the rail portion 132 of the first rail 13 and the second rail 15 on the other side of the main plate body 11 are misaligned. Specifically, when the first rail 13 is in the initial position, the first bearing surface 1321 of the first rail 13 and the second bearing surface 151 of the second rail 15 are substantially aligned with each other, and are used to support and guide a server host. When the first rail 13 is in the uplift position, the first bearing surface 1321 and the second bearing surface 151 have a step G in vertical direction, in other words, the first bearing surface 1321 is obviously in a position further away from the second engaging portion 19 or closer to the first engaging portion 17 compared with the second bearing surface 151.

Figure 4A:
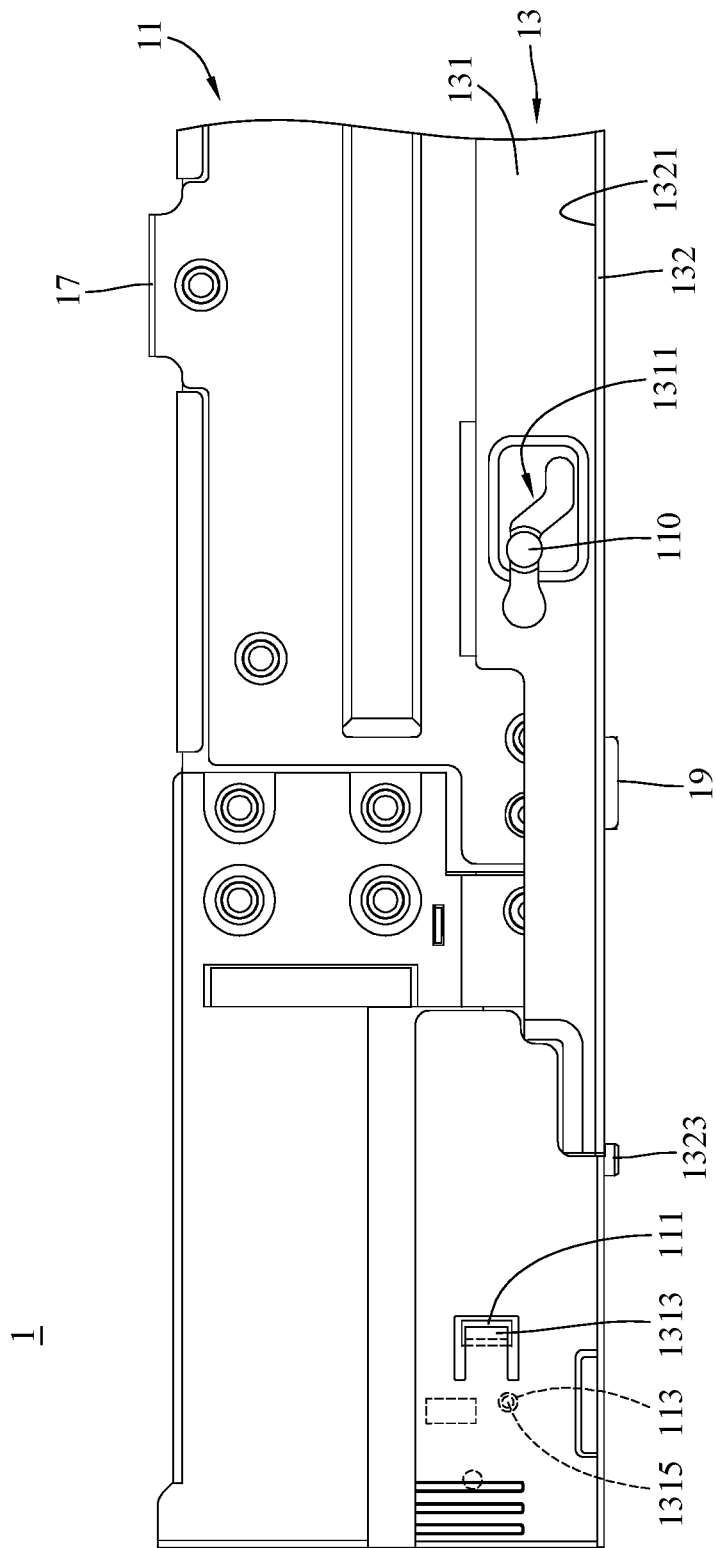
FIG. 4A is a side view of a first rail of the detachable partition assembly in FIG. 1 when the first rail is in an initial position.
Figure 4B:
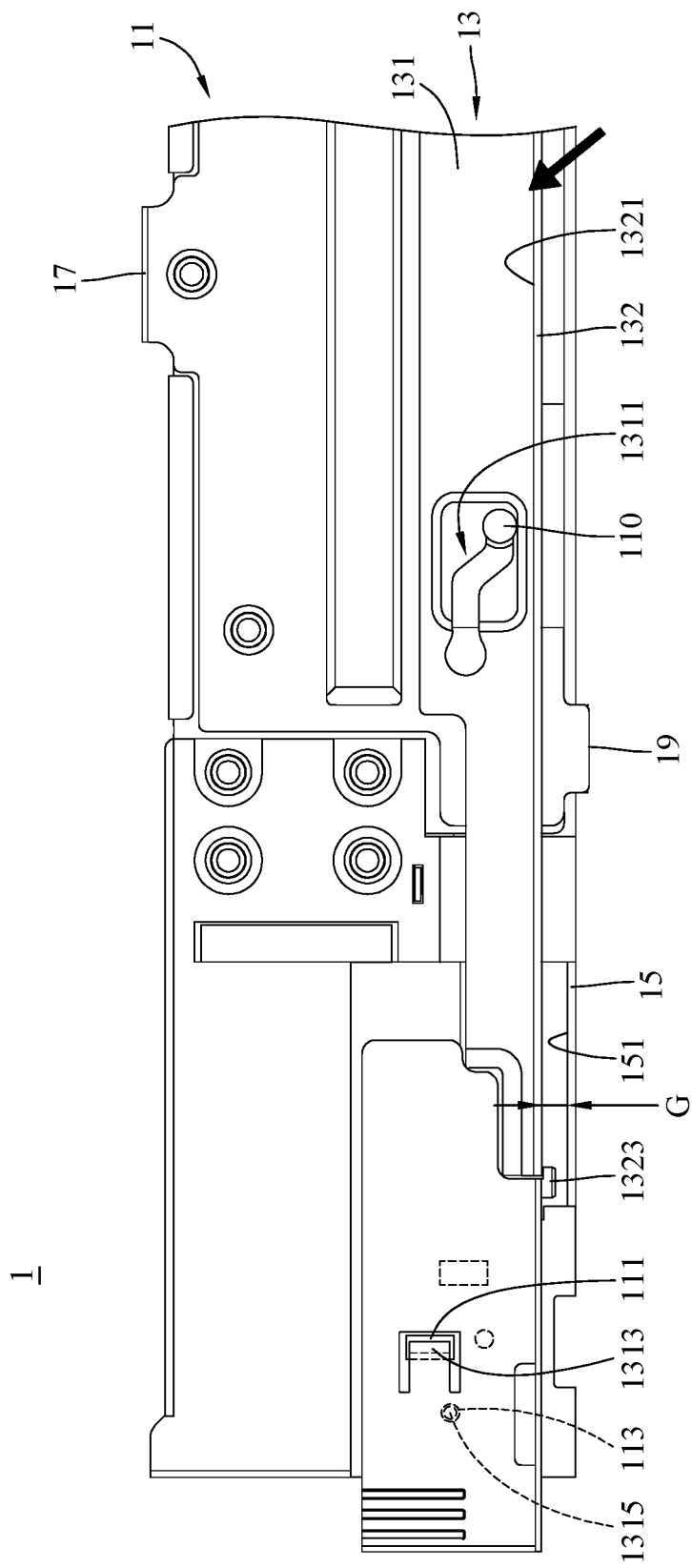
FIG. 4B depicts that the first rail of the detachable partition assembly in FIG. 4A is switched to an uplift position.

Herein, as shown, in this embodiment, part of the guide hole 1311 is inclined relative to the first edge 1111 and the second edge 1112 of the main plate body 11; specifically, part of the guide hole 1311 extends in a direction not parallel to the first edge 1111 and the second edge 1112 main plate body 11. In other words, part of the guide hole 1311 extends in a direction that is at an angle (e.g., an acute or obtuse angle) to the first edge 1111 or the second edge 1112 of the main plate body 11. Therefore, during the movement of the first rail 13 between the initial position and the uplift position, the guide hole 1311 allows the guiding post 110 to move along a path inclined with respect to the first edge 1111 and the second edge 1112. In addition, as shown in FIG. 4A, when the first rail 13 is in the initial position, the guiding post 110 of the main plate body 11 may be in another portion of the guide hole 1311 which is substantially parallel to the first edge 1111 and the second edge 1112, such that the first rail 13 can obtain support in a direction substantially perpendicular to the first edge 1111 and the second edge 1112, which prevents the first rail 13 from leaving the initial position due to vibration or impact.

Then, referring to FIGS. 5A-6B, the installation of the detachable partition assembly 1 to the chassis body 2 are depicted. Firstly, please be noted that the height of the main plate body 11 of the detachable partition assembly 1 is approximately the same as the distance between the first layer board 21 and the second layer board 22 of the chassis body 2, and the first engaging portion 17 and the second engaging portion 19 respectively protrude from the opposite edges of the main plate body 11, thus the detachable partition assembly 1 is suitable for being placed into the interlayer space S of the chassis body 2 in an inclined manner (as shown in arrow A1) in order to prevent interference of the first engaging portion 17 and the second engaging portion 19 with the first layer board 21 and the second layer board 22 of the chassis body 2. Also, before the placement of the detachable partition assembly 1, the first rail 13 which protrudes outwards from the main plate body 11 can be switched to the uplift position to prevent the rail portion 132 of the first rail 13 from interfering with the second layer board 22 of the chassis body 2 while the detachable partition assembly 1 is being turned upright (as shown in arrow A2). The said "turned upright" means that the detachable partition assembly 1 is being rotated to an upright position substantially perpendicular to the first layer board 21 or the second layer board 22 from an inclined position. As the detachable partition assembly 1 has been turned upright, the detachable partition assembly 1 is substantially perpendicular to the first layer board 21 or the second layer board 22 and can divide the interlayer space S.

Figure 5A:
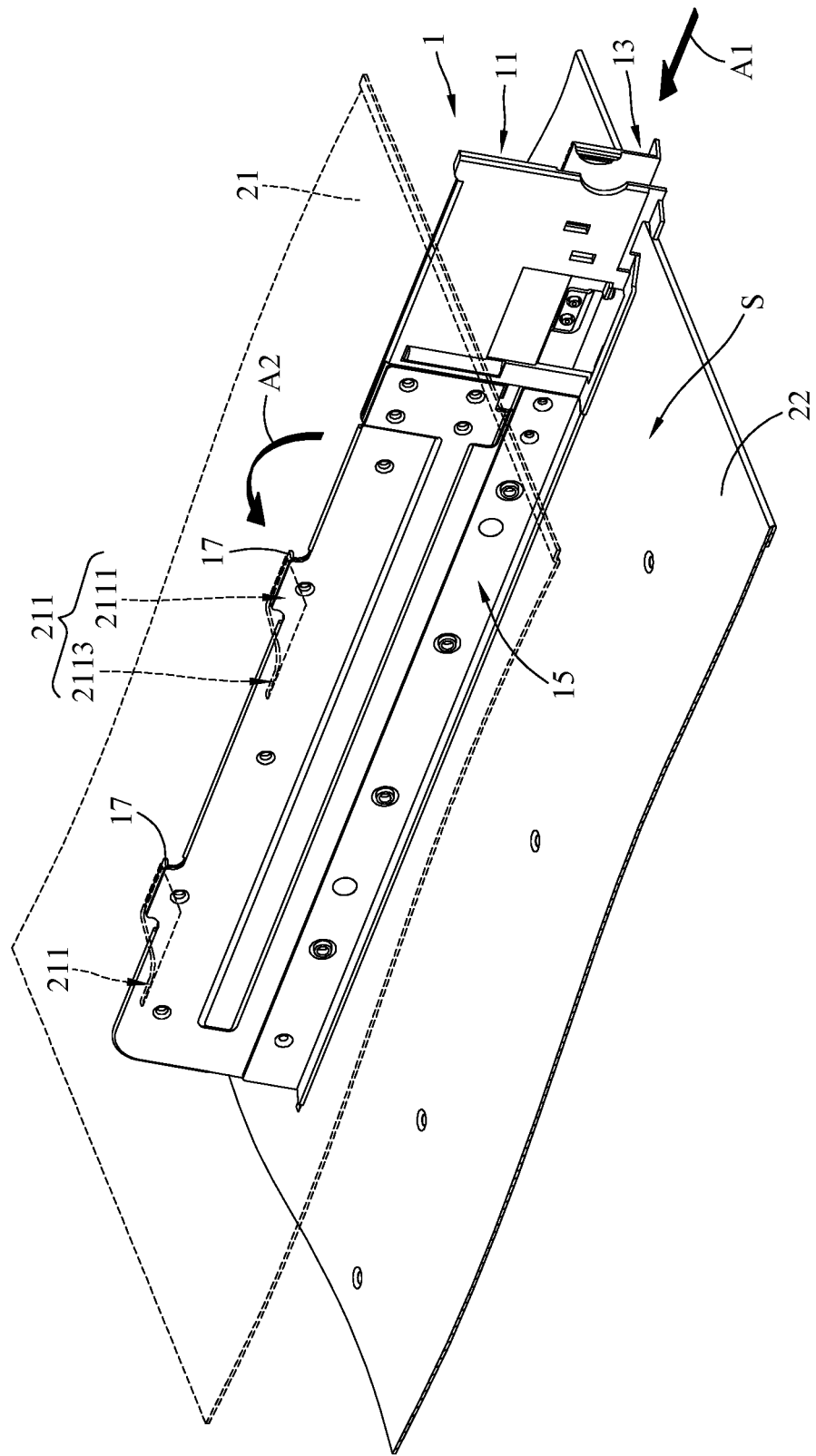
FIGS. 5A-5B depict the installation of placing the detachable partition assembly into a chassis body.
Figure 5B:
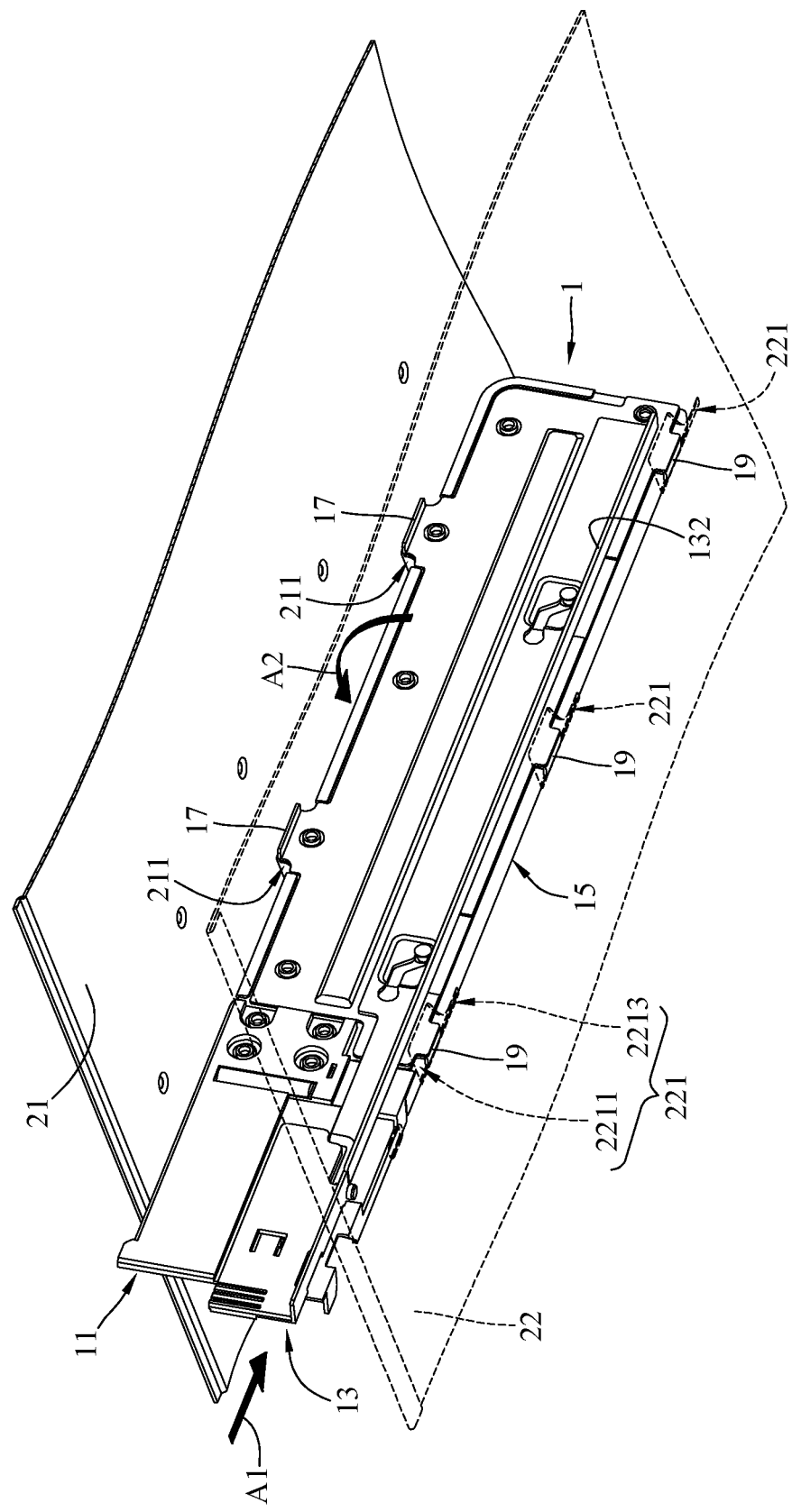

As shown in FIGS. 5A-5B, the first engaging portions 17 of the main plate body 11 can be respectively engaged into the first mounting holes 211 of the first layer board 21, and the second engaging portions 19 of the main plate body 11 can be respectively engaged into the second mounting holes 221 of the second layer board 22. In this embodiment, the first mounting hole 211 and the second mounting hole 221 may have the same or similar configuration: the first mounting hole 211 may at least include a first wide portion 2111 and a first narrow portion 2113 connected to each other, and the second mounting hole 221 may at least include a second wide portion 2211 and a second narrow portion 2213 connected to each other. While the detachable partition assembly 1 located between the first layer board 21 and the second layer board 22 is being turned upright, the first engaging portions 17 will enter the first wide portions 2111, and the second engaging portions 19 will enter the second wide portion 2211.

Figure 6A:
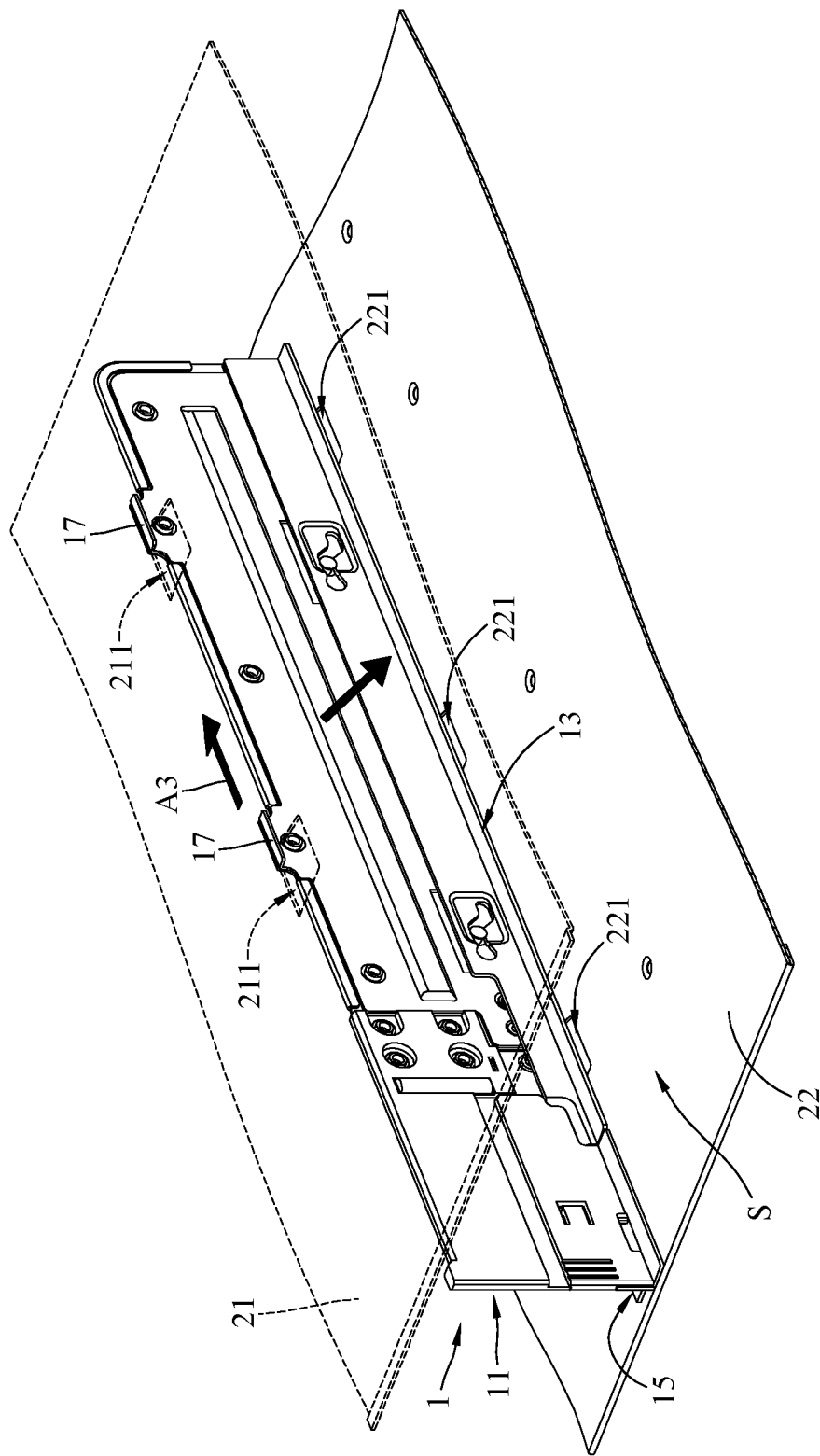
FIGS. 6A-6B depict the installation of engaging the detachable partition assembly to a mounting hole of the chassis body.
Figure 6B:
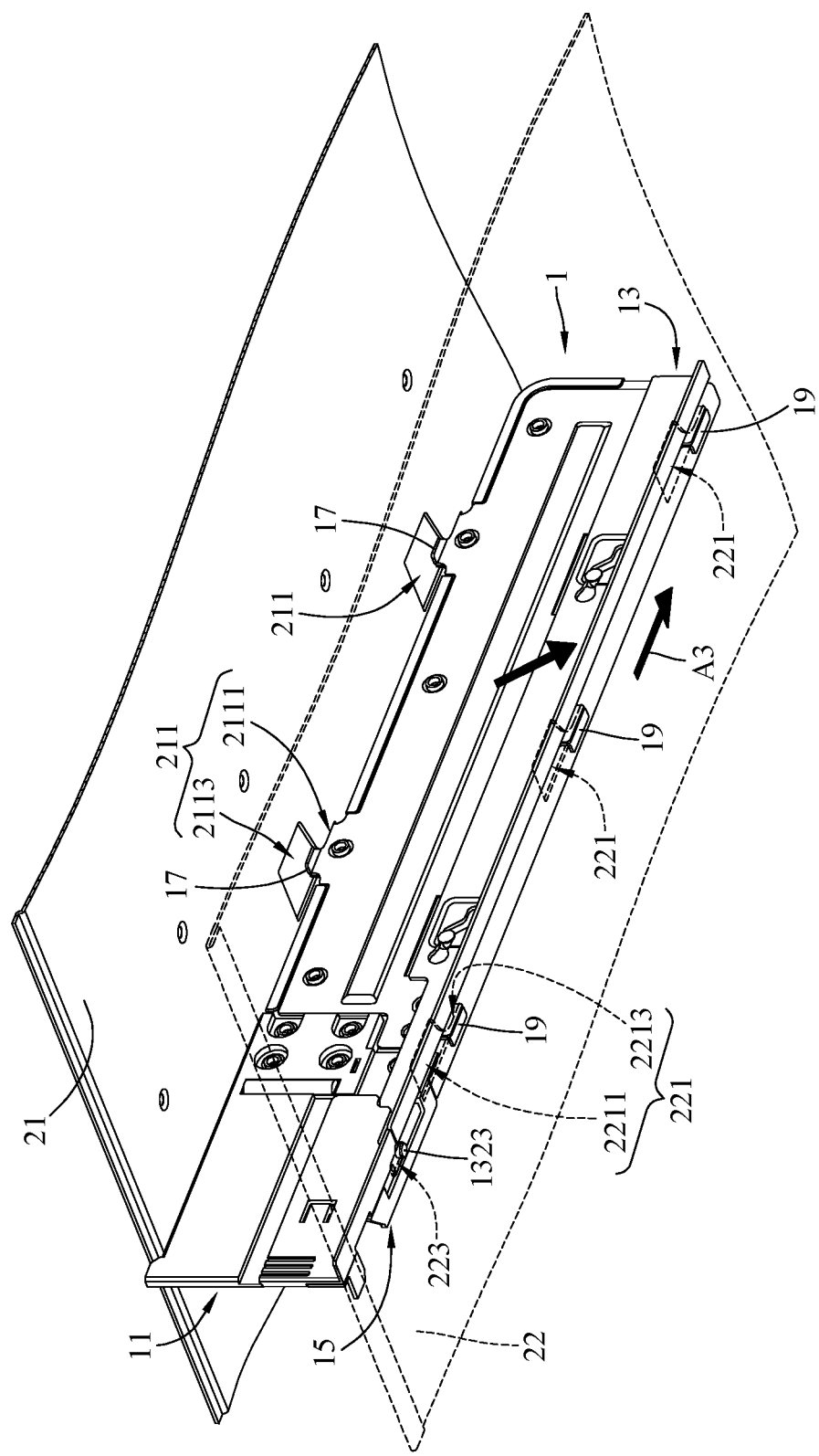

Then, as shown in FIGS. 6A-6B, the detachable partition assembly 1 has been turned upright, and then the first rail 13 can be pushed back to the initial position to be aligned with the second rail 15. Herein, please also refer to FIG. 3B, in this embodiment, the rail portion 132 of the first rail 13 further has a positioning post 1323, and the second layer board 22 further has a guide slot 223, when the detachable partition assembly 1 is turned upright to put the first engaging portions 17 and the second engaging portions 19 respectively into the first wide portion 2111 of the first mounting holes 211 and the second wide portion 2211 of the second mounting holes 221, pushing the first rail 13 back to the initial position can make the positioning post 1323 enter the guide slot 223 of the second layer board 22.

Then, the detachable partition assembly 1 can be pushed inwards the interlayer space S (as shown in arrow A3), during this movement of the detachable partition assembly 1, the positioning post 1323 of the first rail 13 is moved along the guide slot 223 of the second layer board 22. Note that the cooperation of the positioning post 1323 and the guide slot 223 can maintain the detachable partition assembly 1 to move along the predetermined path. On the other hand, during the same movement of the detachable partition assembly 1, the first engaging portion 17 can be moved to the first narrow portion 2113 from the first wide portion 2111, and the second engaging portion 19 of the main plate body 11 can be moved to the second narrow portion 2213 from the second wide portion 2211. As a result, the detachable partition assembly 1 can be installed and fixed in position by the cooperation of the first engaging portions 17, the second engaging portions 19, the first narrow portions 2113 of the first mounting hole 211, and the second narrow portions 2213 of the second mounting hole 221.

Figure 7:
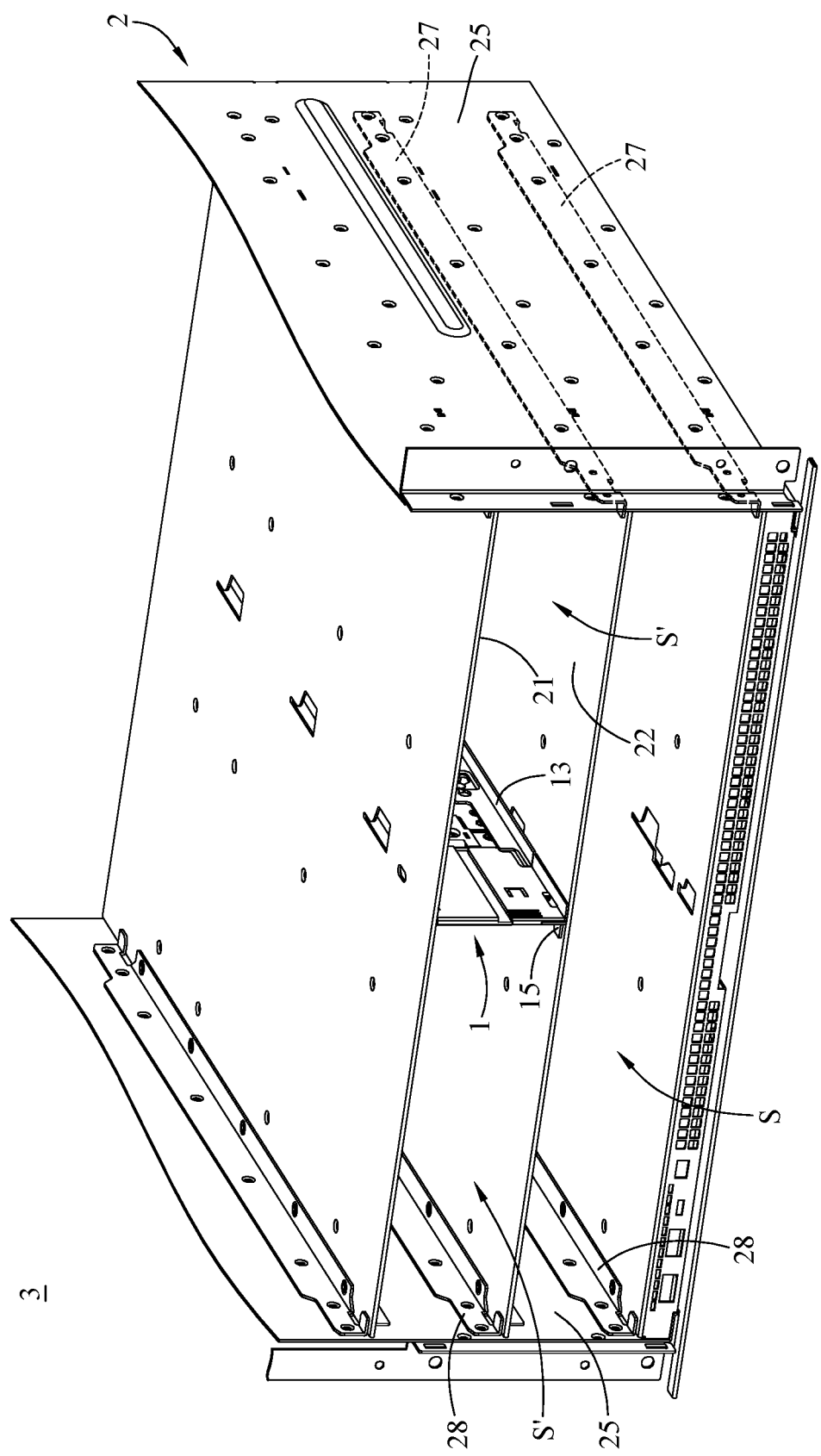
FIG. 7 depicts a perspective view of the detachable partition assembly which has been installed in position in the chassis body.
Figure 8:
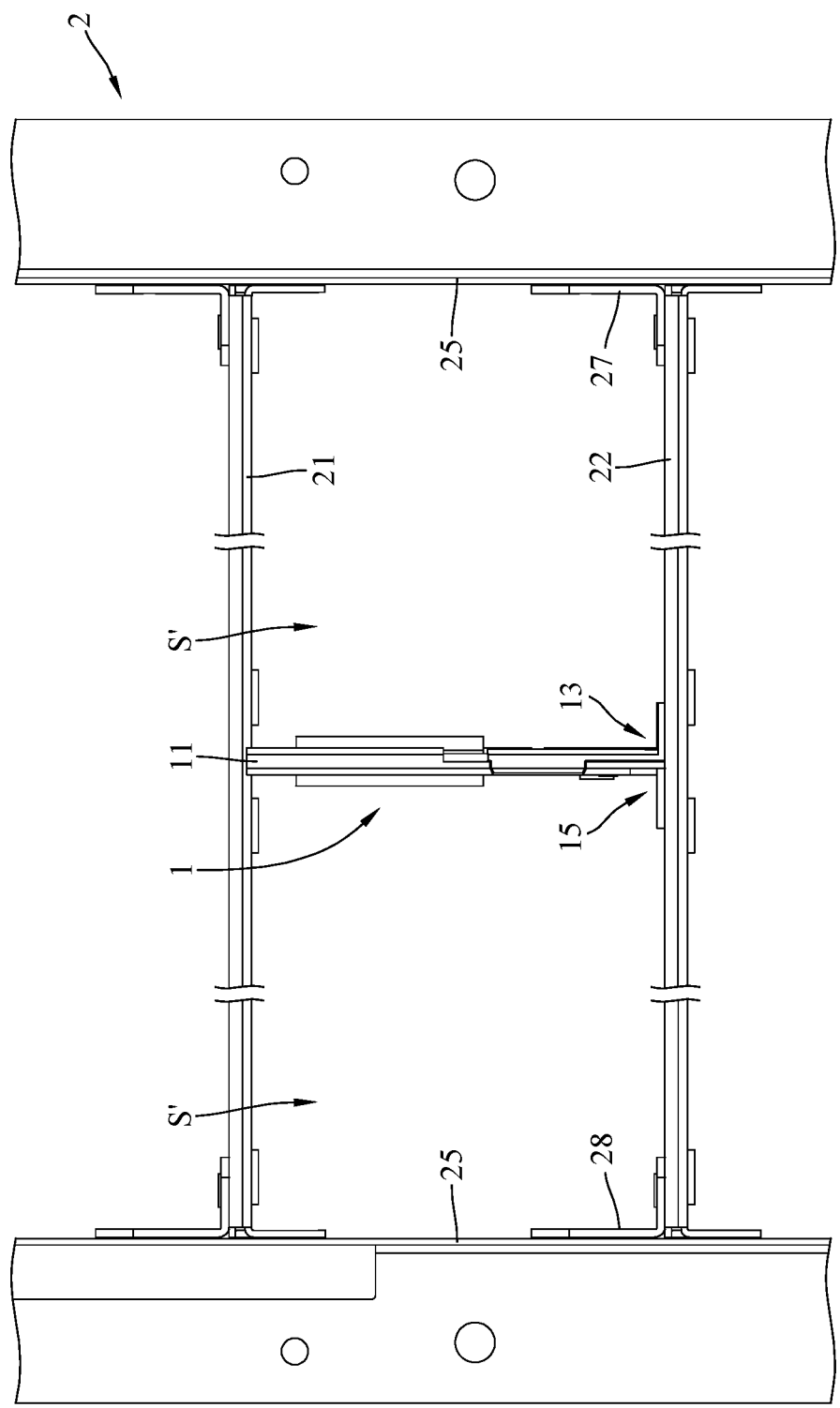
FIG. 8 is a front view of the chassis in FIG. 7.

Then, please refer to FIGS. 7-8, the installed detachable partition assembly 1 divides the interlayer space S of the chassis body 2 into at least two smaller sub-interlayer spaces S', at this moment, the first rail 13 and the second rail 15 of the detachable partition assembly 1 are stacked on the second layer board 22, such that the first rail 13 and rail 27 and the second rail 15 and the rail 28 can respectively be used to support the server hosts being accommodated in the sub-interlayer spaces S', where the first rail 13 and rail 27 and the second rail 15 and the rail 28 are able to reduce the friction occurring during the sliding of the server hosts. Moreover, the detachment or removal of the detachable partition assembly 1 can be achieved by the aforementioned steps in reverse order, thus the repetitive descriptions are omitted.

As discussed, the easy installation/detachment of the detachable partition assembly 1 is convenient for the users to adjust the internal space of the chassis 3 according to their requirements, thereby achieving flexible space management. Meanwhile, the detachable partition assembly 1 also offers rails (e.g., the first rail 13 and the second rail 15) for the sliding of the server hosts so that the server hosts can be spaced apart from the layer board of the chassis 3, which prevents a large area of the server hosts from contacting the surface of the layer board and thereby greatly reducing the friction and saving effort in sliding the server hosts. In short, the detachable partition assembly 1 of this embodiment can be quickly installed/detached to optimize the internal space utilization of the chassis 3 and can be served as rails to facilitate the sliding of the sever hosts.

Also, the first rail 13 of the detachable partition assembly 1 is movable towards or away from the first edge 1111 with respect to the second rail 15; thus, during the placement of the detachable partition assembly 1 into the chassis body 2, the first rail 13 can be switched to a position (i.e., the uplift position) not interfering with the layer board of the chassis body so as to allow the detachable partition assembly 1 having engaging portions (i.e., the first engaging portion 17 and the second engaging portion 19) and rails (i.e., the first rail 13 and the second rail 15) to be installed to the desired position.

Figure 9:
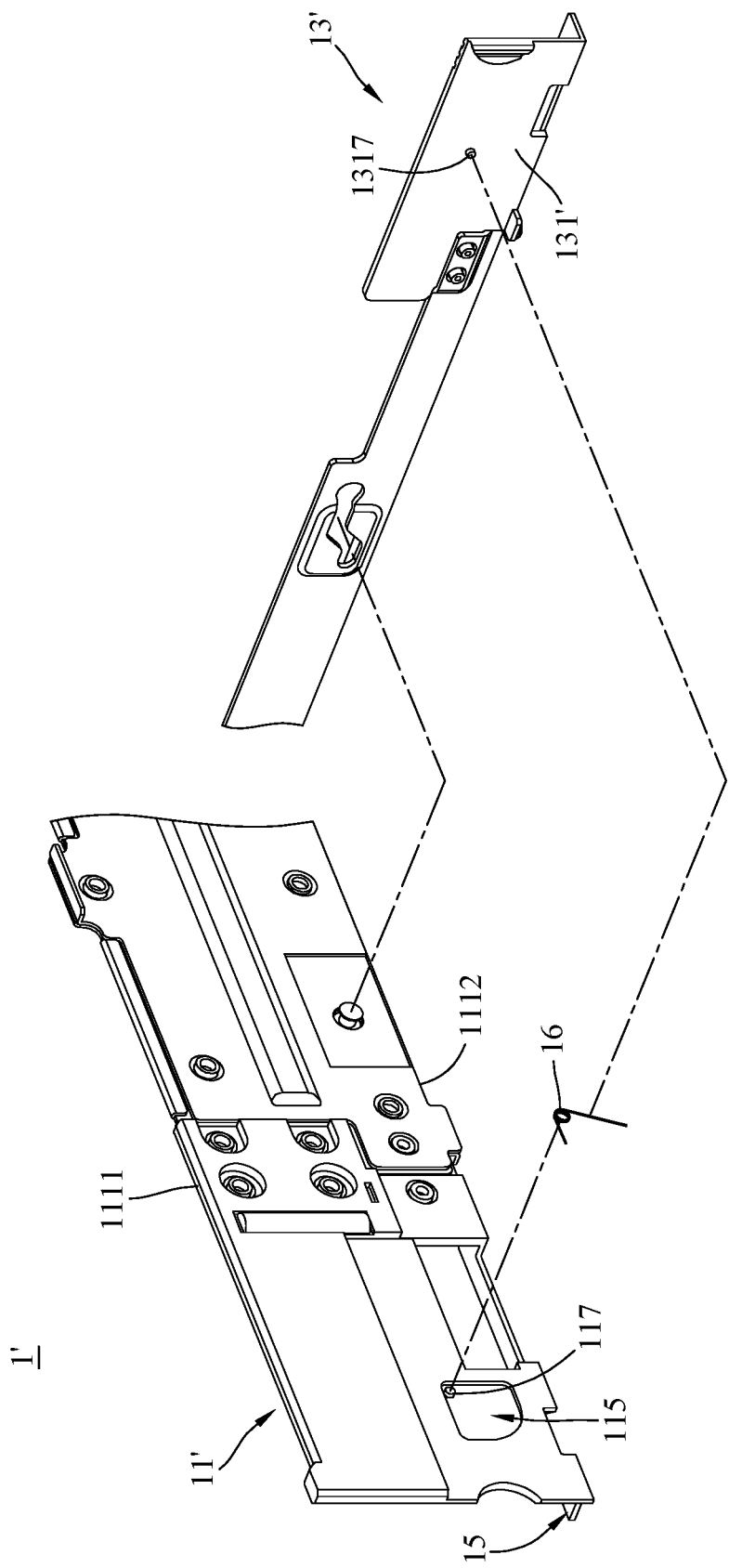
FIG. 9 is a partial perspective exploded view of a detachable partition assembly according to another embodiment of the disclosure.
Figure 10:
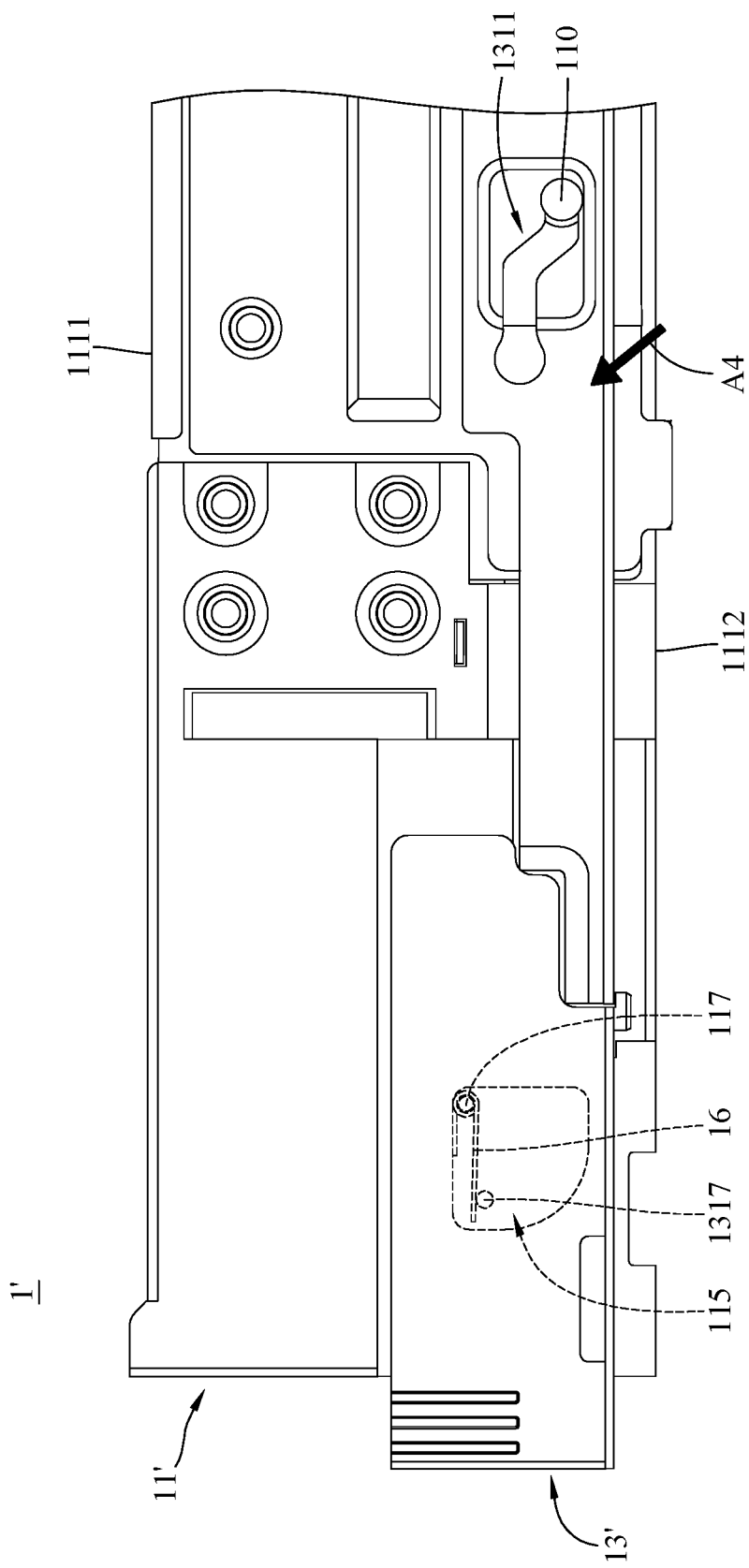
FIG. 10 depicts that a first rail of the detachable partition assembly in FIG. 9 is switched to an uplift position.

However, the previous embodiment is an exemplary detachable partition assembly of the disclosure and not intended to limit the disclosure. For example, please refer to FIGS. 9-10, another embodiment of the disclosure provides a detachable partition assembly 1', where FIG. 9 is a partial perspective exploded view of the detachable partition assembly 1', and FIG. 10 depicts that a first rail 13' of the detachable partition assembly 1' in FIG. 9 is switched to an uplift position. For the purposes of simple illustration and easy comprehension, FIGS. 9-10 may only illustrate part of the detachable partition assembly 1', only the main differences between this and previous embodiments will be described, the same or similar components can be comprehended with reference to the aforementioned descriptions, and the same or similar components may be numbered the same number.

Specifically, as shown in FIG. 9, the detachable partition assembly 1' may include a torsion spring 16, a main plate body 11' of the detachable partition assembly 1' may include a recess 115 and a protrusion 117, and a mounting portion 131' of the first rail 13' may have a protrusion 1317. As shown, the protrusion 117 is located in the recess 115, the torsion spring 16 is mounted on the protrusion 117 and also located in the recess 115, one arm of the torsion spring 16 (not numbered) presses against the inner wall (not numbered) of the recess 115, and the protrusion 1317 is movably located in the recess 115 and contacts the other arm (not numbered) of the torsion spring 16. In such an arrangement, the inner wall of the recess 115 and the protrusion 1317 can together clamp the torsion spring 16, and the relative movement of the inner wall of the recess 115 and the protrusion 1317 can force the torsion spring 16 to deform.

As shown in FIG. 10, during the movement of the first rail 13' being pushed to the uplift position from the initial position, as shown in arrow A4, the protrusion 1317 of the first rail 13' and the inner wall of the recess 115 of the main plate body 11' can together force the torsion spring 16 to deform. The deformed torsion spring 16 stores elastic potential energy used for restoring the protrusion 1317 (i.e., restoring the first rail 13' to the initial position). As such, when the detachable partition assembly 1' is turned upright, the torsion spring 16 can force the first rail 13' to move back to the initial position once the first rail 13' is released.

Figure 11:
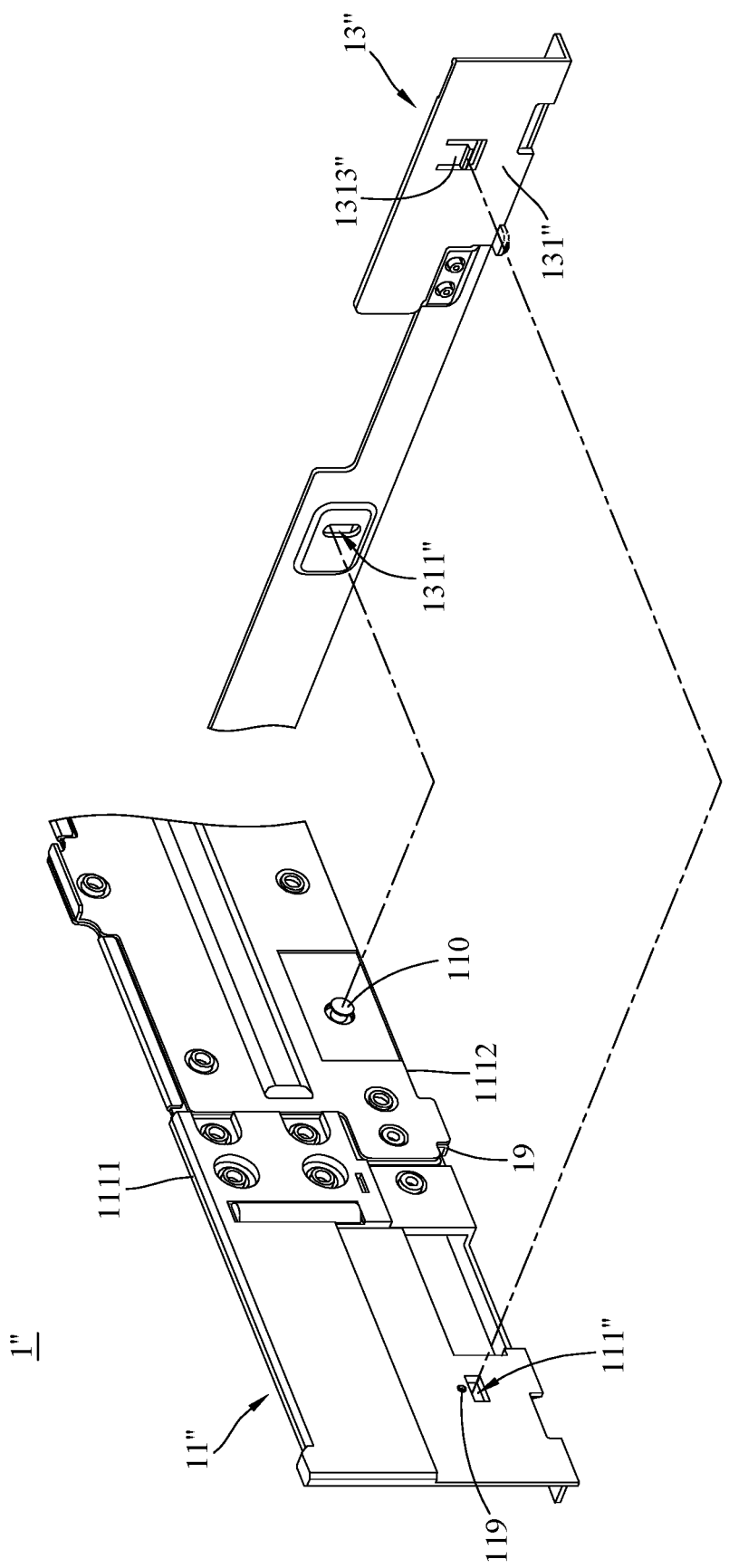
FIG. 11 is a partial perspective exploded view of a detachable partition assembly according to yet another embodiment of the disclosure.
Figure 12:
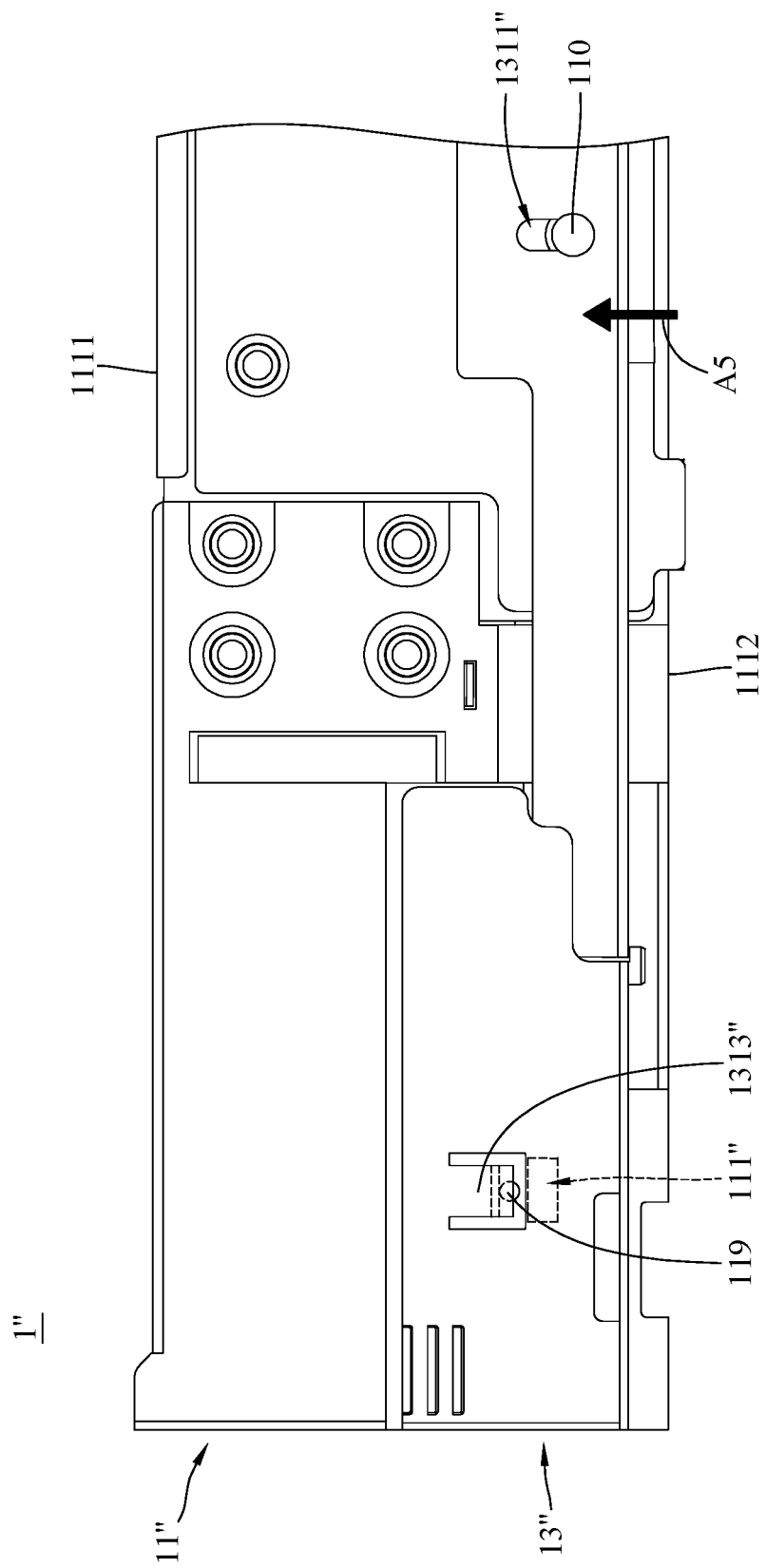
FIG. 12 depicts that a first rail of the detachable partition assembly in FIG. 11 is switched to an uplift position.

Alternatively, please refer to FIGS. 11-12, a detachable partition assembly 1" according to still another embodiment of the disclosure is provided, where FIG. 11 is a partial perspective exploded view of the detachable partition assembly 1", and FIG. 12 depicts that a first rail 13" of the detachable partition assembly 1" is switched to an uplift position. For the purposes of simple illustration and easy comprehension, FIGS. 11-12 may only illustrate part of the detachable partition assembly 1", only the main differences between this and previous embodiments will be described, the same or similar components can be comprehended with reference to the aforementioned descriptions, and the same or similar components may be numbered the same number.

Specifically, as shown in FIG. 11, a main plate body 11" of the detachable partition assembly 1" may have a positioning slot 111" and a protruding dot or bump 119, and a mounting portion 131" of the first rail 13" may have at least one guide hole 1311" and an elastic positioning plate 1313". As shown, the bump 119 is located at a side of the positioning slot 111" away from the second edge 1112, the elastic positioning plate 1313" may be detachably engaged with the positioning slot 111", the guide hole 1311" may be a straight guide hole, Specifically, part of the guide hole 1311" may extend in a direction substantially perpendicular to the first edge 1111 and the second edge 1112 of the main plate body 11".

In such an arrangement, during the movement of the first rail 13" being pushed to the uplift position from the initial position, as shown in FIG. 12, the cooperation of the guiding post 110 and the guide hole 1311" enables a movement of the first rail 13" in a direction substantially perpendicular to the first edge 1111 and the second edge 1112 of the main plate body 11" (as shown in arrow A5). By doing so, the elastic positioning plate 1313" is removed from the positioning slot 111" and moved to a position pressing against the bump 119, and the elastic positioning plate 1313" is, but not limited to, contact the curved surface of the bump 119 with an inclined or flat surface so that the contact area between the bump 119 and the elastic positioning plate 1313" is relatively small. At this moment, if there is no external force to keep the first rail 13" in the uplift position, the weight of the first rail 13" or a slight vibration may easily cause the elastic positioning plate 1313" to leave the bump 119 to move to the position engaging with the positioning slot 111" (i.e., the initial position). Accordingly, as the first rail 13" is released from the uplift position, the first rail 13" may go back to the initial position by its weight.

Figure 13:
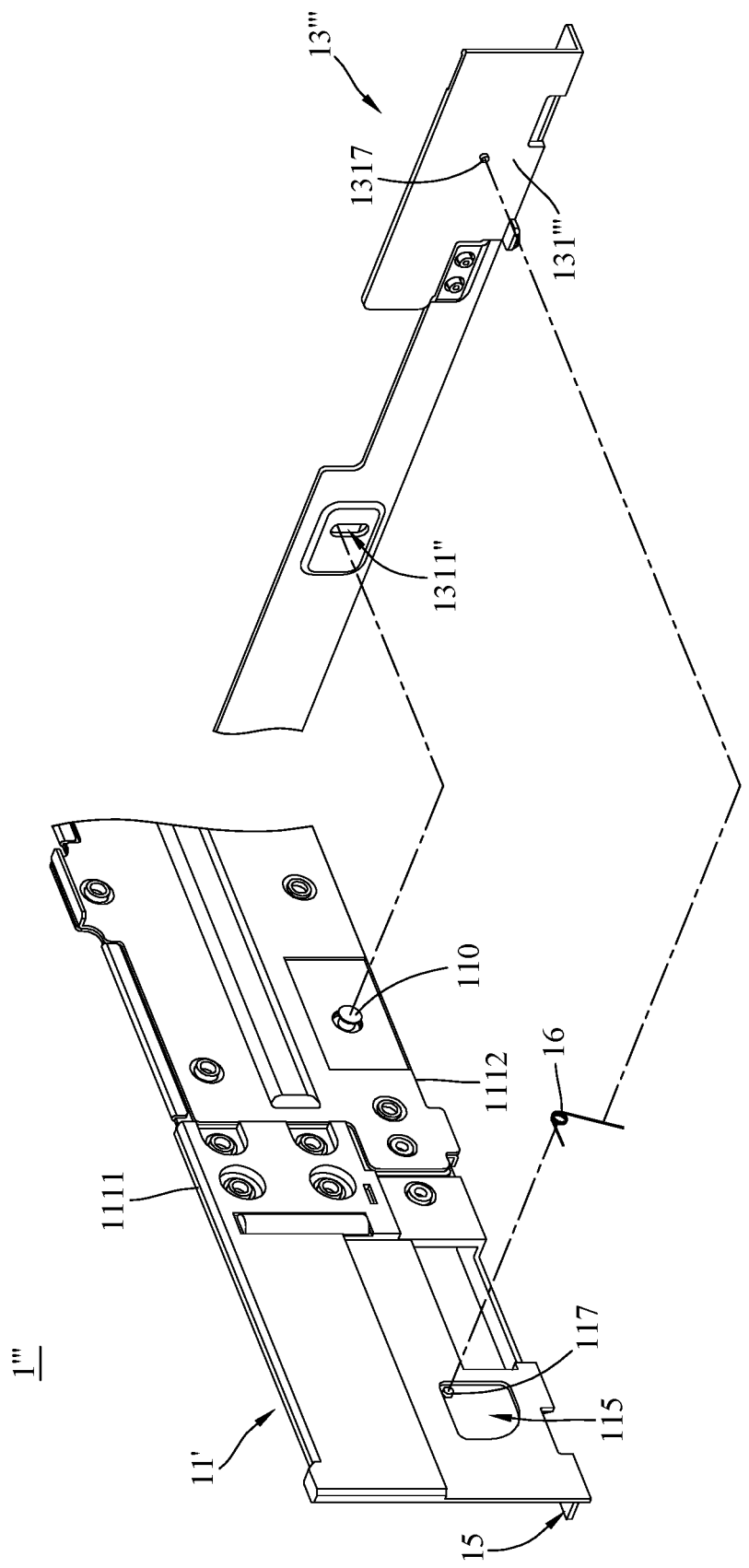
FIG. 13 is a partial perspective exploded view of a detachable partition assembly according to still another embodiment of the disclosure.
Figure 14:
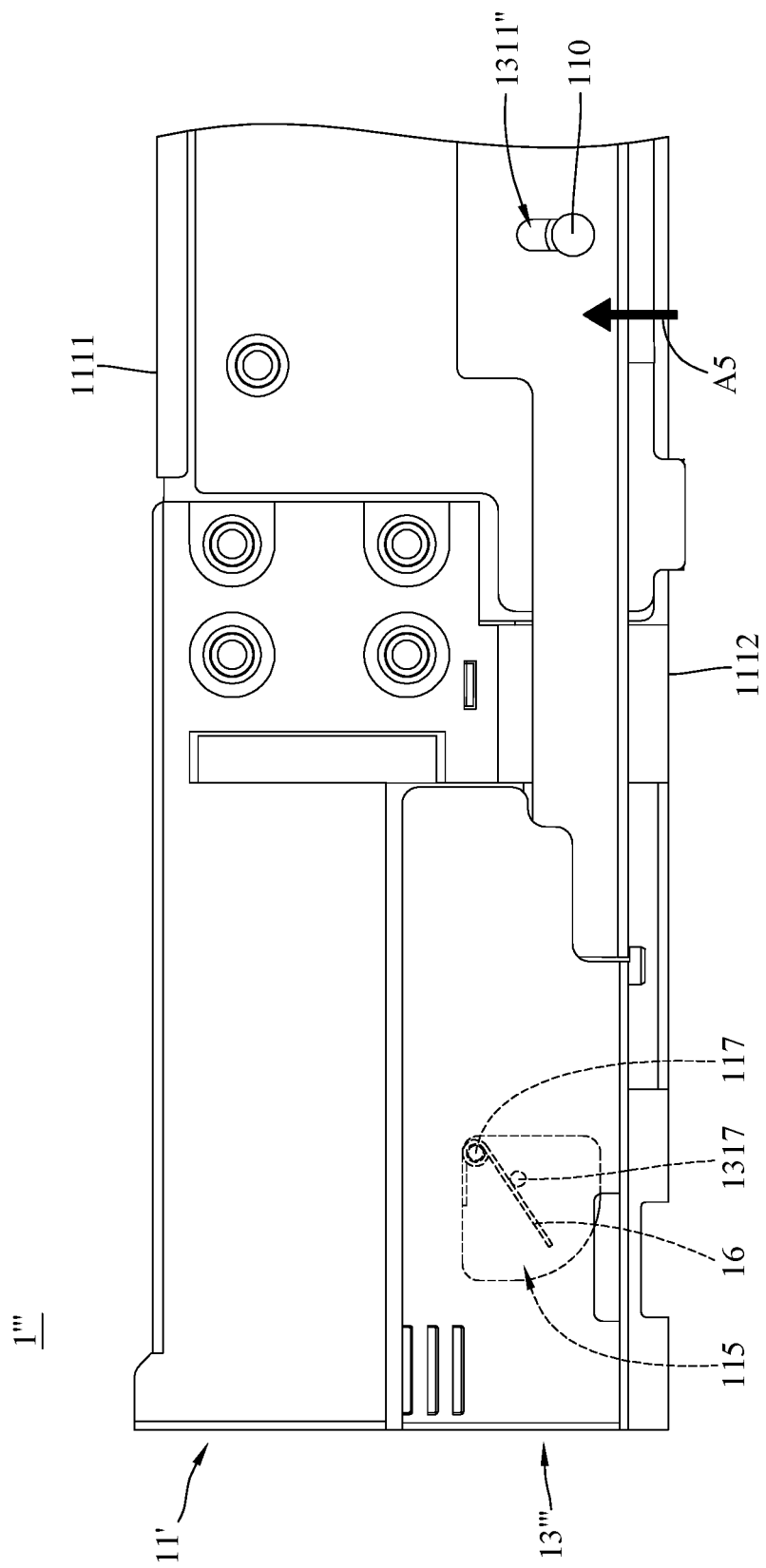
FIG. 14 depicts that a first rail of the detachable partition assembly in FIG. 13 is switched to an uplift position.

Alternatively, please refer to FIGS. 13-14, a detachable partition assembly 1''' according to still another embodiment of the disclosure is provided, where FIG. 13 is a partial perspective exploded view of the detachable partition assembly 1''', and FIG. 14 depicts that a first rail 13''' of the detachable partition assembly 1''' is switched to an uplift position. For the purposes of simple illustration and easy comprehension, FIGS. 13-14 may only illustrate part of the detachable partition assembly 1''', only the main differences between this and previous embodiments will be described, the same or similar components can be comprehended with reference to the aforementioned descriptions, and the same or similar components may be numbered the same number.

Specifically, as shown in FIG. 13, the detachable partition assembly 1''' includes the main plate body 11' of the aforementioned embodiments, thus the repetitive descriptions are omitted. And a mounting portion 131''' of the first rail 13''' may have the guide hole 1311" and the protrusion 1317 mentioned in the previous embodiments, thus the repetitive descriptions are omitted.

In such an arrangement, during the movement of the first rail 13''' being pushed to the uplift position from the initial position, as shown in FIG. 14, the first rail 13''' is only allowed to move along a direction substantially perpendicular to the first edge 1111 of the main plate body 11' (as shown in arrow A5). During this movement, the inner walls of the protrusion 1317 and the recess 115 of the main plate body 11' can together force the torsion spring 16 to deform so that the torsion spring 16 will store elastic potential energy used for restoring the first rail 13". Thus, similar to the aforementioned embodiments, when the detachable partition assembly 1''' is turned upright, the torsion spring 16 can force the first rail 13''' to move back to the initial position once the first rail 13''' is released.

Figure 15:
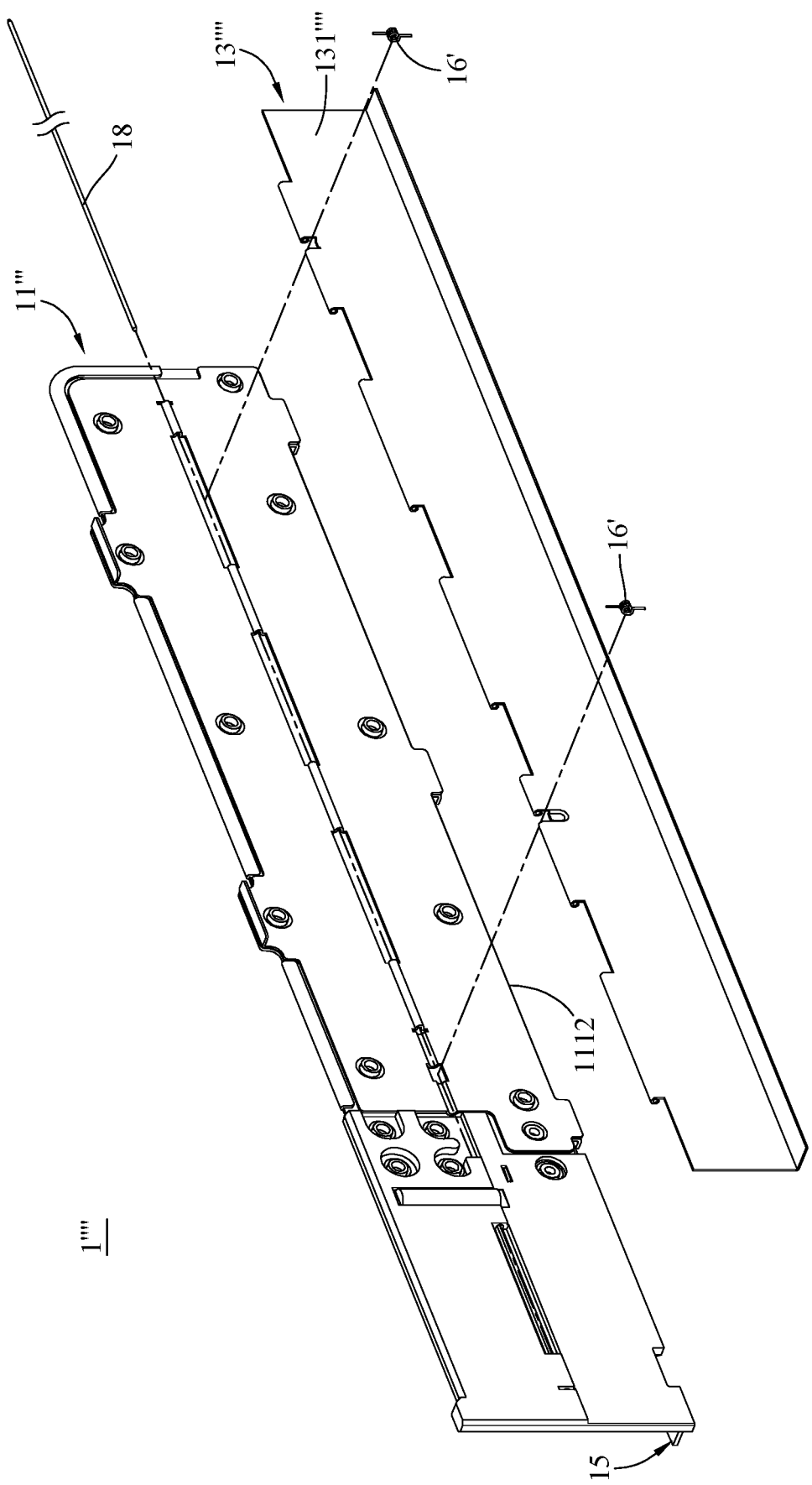
FIG. 15 is a perspective exploded view of a detachable partition assembly according to a further another embodiment of the disclosure.
Figure 16A:
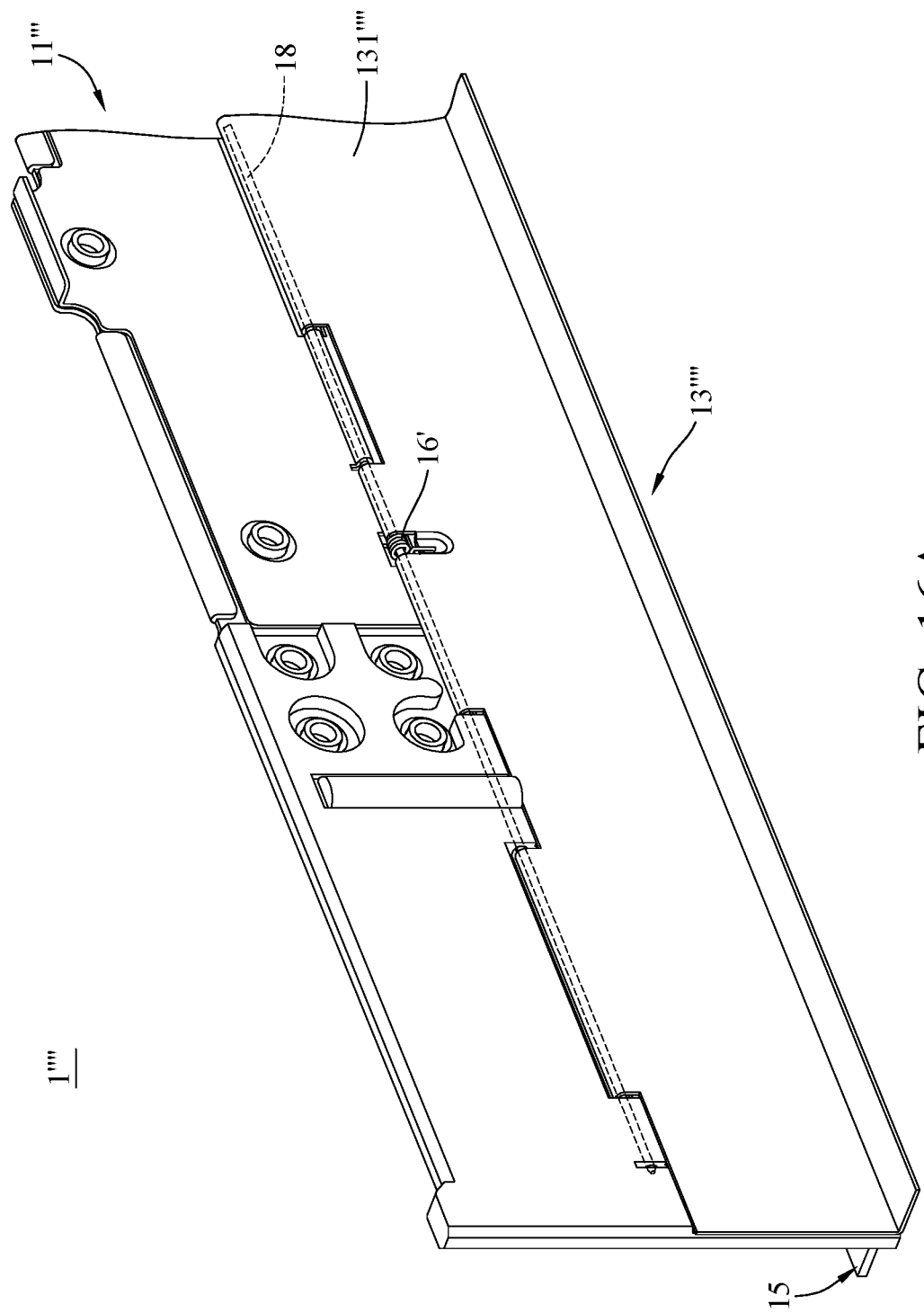
FIGS. 16A-16B depict that a first rail of the detachable partition assembly in FIG. 15 is switched between an uplift position and an initial position.
Figure 16B:
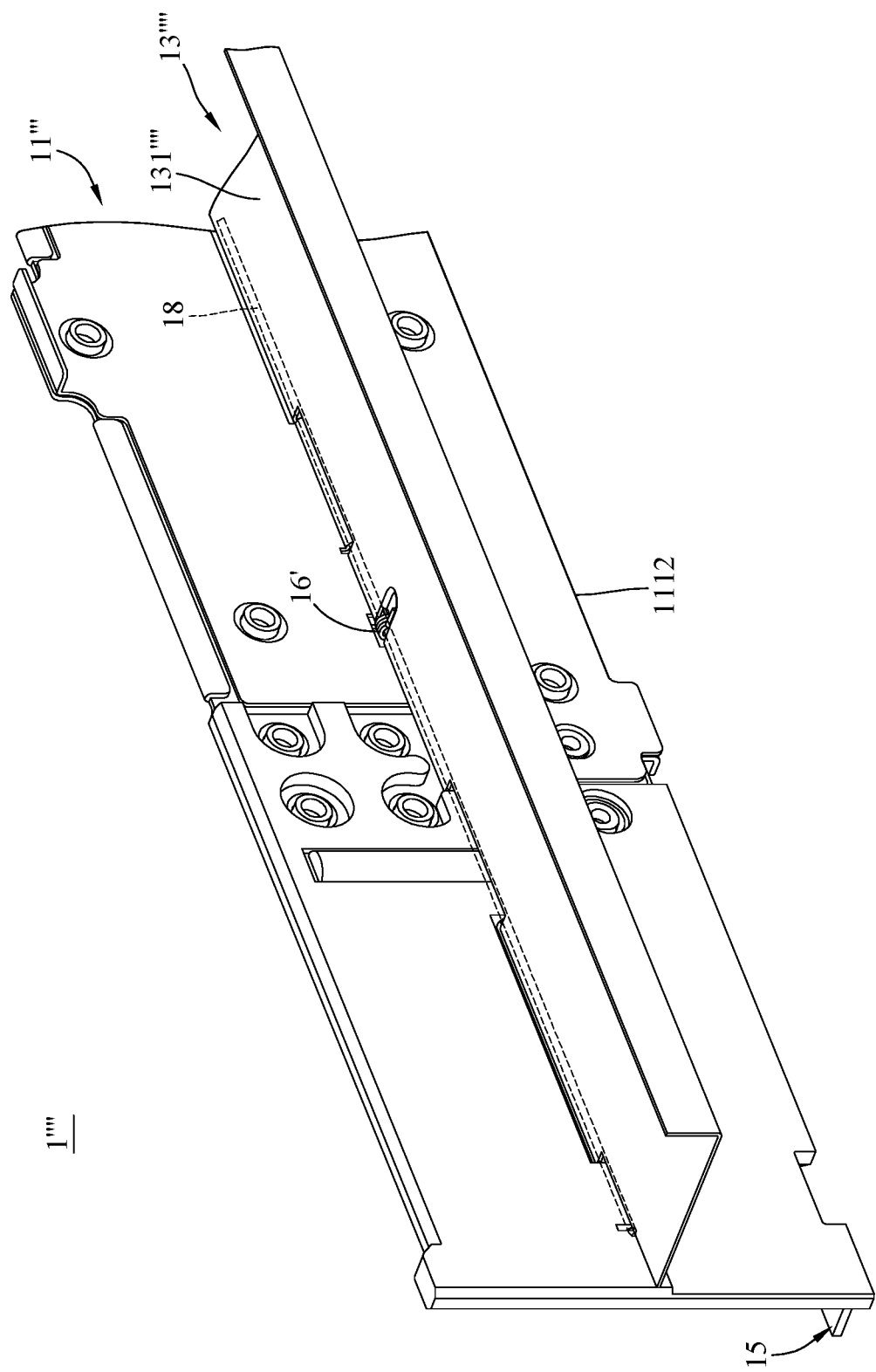

It is noted that the above embodiments are exemplary. In a further another embodiment, the first rail may be pivotally connected to the main plate body. Specifically, referring to FIGS. 15-16B, a detachable partition assembly 1'''' is provided. For the purposes of simple illustration and easy comprehension, FIGS. 16A-16B may only illustrate part of the detachable partition assembly 1'''', only the main differences between this and previous embodiments will be described, the same or similar components can be comprehended with reference to the aforementioned descriptions, and the same or similar components may be numbered the same number. In this embodiment, the detachable partition assembly 1'''' includes a first rail 13' having a mounting portion 131'''' being hinged to a main plate body 11'''' via, for example, at least one suitable shaft or hinge 18. In this arrangement, the first rail 13'''' may look no different from the first rails in the aforementioned embodiments when it is in the initial position (shown in FIG. 16A), but the first rail 13'''' can be pivotally disposed on a side of the main plate body 11'''' and therefore can be switched to the uplift position (shown in FIG. 16B) to change its position relative to the second edge 1112 of the main plate body 11'''' by being pivoted relative to the main plate body 11''''. As such, the pivotable first rail 13'''' is also able to achieve the purpose of installing the detachable partition assembly 1'''' having the engaging portions (e.g., the first engaging portions 17 and the second engaging portions 19) and the rail (e.g., the second rail 15) without having interference with the layer boards of the chassis body.

Also, the detachable partition assembly 1'''' of this embodiment may omit the structures for sliding the first rail, such as the guiding post and guide hole discussed in the previous embodiments. In addition, in this embodiment, at least one restoring piece 16' (e.g., torsion spring) may be applied to the shaft or hinge 18 of the first rail 13'''' for restoring the first rail 13'''' once the first rail 13'''' is released.

Lastly, in some other embodiments, the second rail of the detachable partition assembly may be replaced with the first rail of any one of the previous embodiments to become movable with respect to the main plate body; in such an arrangement, the rails on two opposite sides of the main plate body are both switchable between the initial position and the uplift position. However, the second rail is optional; in one embodiment, the detachable partition assembly may not have the second rail but still have the first rail of any one of the embodiments installed on one side of the main plate body.

According to the detachable partition assembly and the chassis having the same as discussed in the above embodiments, the detachable partition assembly can be detachably engaged with the layer board of the chassis via the first engaging portion and the second engaging portion so as to quickly divide the internal space of the chassis into plural required areas. Therefore, the convenient installation/removal of the detachable partition assembly can make the management of the internal space of the chassis flexible to meet the requirements, such as placement of different sized server hosts, and thereby optimizing the internal space utilization of the chassis.

Also, the first rail and the second rail of the detachable partition assembly can be served to support and guide the server hosts being accommodated in the chassis to minimize the contact area between the server hosts and the layer board so as to largely reduce the friction occurring during the sliding of the server hosts, thereby saving effort in sliding the server hosts on the chassis.

In addition, the first rail is movable to change its position relative to the second edge of the main plate body, which allows the first rail to be moved to a position that does not have interference with the layer board of the chassis during the placement of the detachable partition assembly into the chassis body. As can be seen here, the movable first rail makes it possible to install the detachable partition assembly having engaging portions and rails into a space having similar height.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A detachable partition assembly, comprising:
   a main plate body, having a first edge and a second edge opposite to each other;
   a first engaging portion and a second engaging portion, respectively protruding outwards from the first edge and the second edge; and
   a first rail and a second rail, wherein the first rail and the second rail are respectively located at two opposite sides of the main plate body, the first rail is movable with respect to the second edge of the main plate body and has a first bearing surface alignable with a second bearing surface of the second rail.

2. The detachable partition assembly according to claim 1, wherein one of the first rail and the main plate body has at least one elastic positioning plate, another one of the first rail and the main plate body has at least one positioning slot, and the at least one elastic positioning plate is removably engaged with the at least one positioning slot.

3. The detachable partition assembly according to claim 1, wherein the main plate body has at least one guiding post, the first rail has at least one guide hole, and the at least one guiding post is slidably located in the at least one guide hole.

4. The detachable partition assembly according to claim 3, wherein part of the at least one guide hole extends in a direction at an angle to the first edge and the second edge of the main plate body.

5. The detachable partition assembly according to claim 3, wherein part of the at least one guide hole extends in a direction substantially perpendicular to the first edge and the second edge of the main plate body.

6. The detachable partition assembly according to claim 3, further comprising a torsion spring, the main plate body having a recess, the first rail having a protrusion, wherein the torsion spring is located in the recess, an inner wall of the recess and the protrusion together clamp the torsion spring.

7. The detachable partition assembly according to claim 1, wherein the first rail is pivotally connected to the main plate body to change the relative position between the first rail and the second edge of the main plate body.

8. A chassis, comprising:
   a chassis body, comprising at least one first layer board and at least one second layer board;
   the detachable partition assembly according to claim 1, located between the at least one first layer board and the at least one second layer board;
   wherein the first engaging portion and the second engaging portion are respectively detachably engaged with the at least one first layer board and the at least one second layer board, and the first rail is stacked on the at least one second layer board.

9. The chassis according to claim 8, wherein the at least one second layer board has a guide slot, the first rail has a positioning post, and the positioning post is slidably located in the guide slot.

10. The chassis according to claim 8, wherein the at least one first layer board has at least one first mounting hole, the at least one second layer board has at least one second mounting hole, the first engaging portion and the second engaging portion are respectively detachably engaged with the at least one first mounting hole and the at least one second mounting hole, the at least one first mounting hole has a first wide portion and a first narrow portion connected to each other, and the at least one second mounting hole has a second wide portion and a second narrow portion connected to each other.

11. The chassis according to claim 8, wherein the first rail is movably located on the main plate body to change a relative position between the first bearing surface and the at least one second layer board.

12. The chassis according to claim 8, wherein the chassis body further comprises a plurality of side plates and a plurality of rails, the plurality of side plates, the at least one first layer board, and the at least one second layer board together form an interlayer space therebetween, the first rail and the second rail are respectively located at two opposite sides of the main plate body, the detachable partition assembly is detachably located between the at least one first layer board and the at least one second layer board to divide the interlayer space into at least two sub-interlayer space, the plurality of rails of the chassis body are disposed on the at least one second layer board and are respectively located in the at least two sub-interlayer space to be respectively corresponding to the first rail and the second rail of the detachable partition assembly.

13. The chassis according to claim 8, wherein the first rail is pivotally connected to the main plate body to change the relative position between the first rail and the second edge of the main plate body.

* * * * *